United States Patent
Ohtani

(10) Patent No.: US 10,707,343 B2
(45) Date of Patent: *Jul. 7, 2020

(54) METHOD OF MANUFACTURING SEMICONDUCTOR DEVICE AND SEMICONDUCTOR DEVICE

(71) Applicant: SHINDENGEN ELECTRIC MANUFACTURING CO., LTD., Chiyoda-ku, Tokyo (JP)

(72) Inventor: Kinya Ohtani, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/086,609

(22) PCT Filed: Mar. 31, 2016

(86) PCT No.: PCT/JP2016/060855
§ 371 (c)(1),
(2) Date: Sep. 20, 2018

(87) PCT Pub. No.: WO2017/168733
PCT Pub. Date: Oct. 5, 2017

(65) Prior Publication Data
US 2019/0097041 A1  Mar. 28, 2019

(51) Int. Cl.
*H01L 29/78* (2006.01)
*H01L 29/40* (2006.01)
(Continued)

(52) U.S. Cl.
CPC ........ *H01L 29/7813* (2013.01); *H01L 29/063* (2013.01); *H01L 29/1095* (2013.01);
(Continued)

(58) Field of Classification Search
CPC .............. H01L 29/7813; H01L 29/063; H01L 29/1095; H01L 29/407; H01L 29/408; H01L 29/66734; H01L 29/401
See application file for complete search history.

(56) References Cited

U.S. PATENT DOCUMENTS 9,324,823 B2 * 4/2016 Blank ................. H01L 21/3083
2007/0138547 A1 * 6/2007 Nakamura ........ H01L 29/66719
257/331
(Continued)

FOREIGN PATENT DOCUMENTS

CN      102403339 A    4/2012
EP       2884540 A1    6/2015
(Continued)

OTHER PUBLICATIONS

International Search Report in PCT/JP2016/060855, dated May 10, 2016, 4pp.
(Continued)

*Primary Examiner* — Christine A Enad
(74) *Attorney, Agent, or Firm* — Hauptman Ham, LLP

(57) ABSTRACT

A method of manufacturing a semiconductor device includes in this order: a semiconductor base body preparing step; a first trench forming step; a first insulation film forming step of forming a first insulation film; a gate insulation film forming step; a gate electrode forming step; a second trench forming step of forming a second trench in the inside of a first trench by removing a center portion of the first insulation film; a second insulation film forming step of forming a second insulation film in the inside of the second trench under a condition that a gap remain in the inside of the second trench; a shield electrode forming step of forming a shield electrode in the inside of the gap; and a source electrode forming step of forming a source electrode.

14 Claims, 17 Drawing Sheets

(51) Int. Cl.
   *H01L 29/06*    (2006.01)
   *H01L 29/10*    (2006.01)
   *H01L 29/66*    (2006.01)
   *H01L 29/423*   (2006.01)
   *H01L 29/417*   (2006.01)
   *H01L 29/739*   (2006.01)

(52) U.S. Cl.
   CPC .......... *H01L 29/401* (2013.01); *H01L 29/407* (2013.01); *H01L 29/408* (2013.01); *H01L 29/42368* (2013.01); *H01L 29/42376* (2013.01); *H01L 29/66734* (2013.01); *H01L 29/41766* (2013.01); *H01L 29/66348* (2013.01); *H01L 29/66727* (2013.01); *H01L 29/7397* (2013.01)

(56) References Cited

U.S. PATENT DOCUMENTS

| | | | |
|---|---|---|---|
| 2010/0155773 A1 | 6/2010 | Parthasarathy et al. | |
| 2012/0061723 A1 | 3/2012 | Ishii | |
| 2013/0062688 A1* | 3/2013 | Kobayashi | H01L 29/407 |
| | | | 257/330 |
| 2013/0137230 A1* | 5/2013 | Blank | H01L 29/407 |
| | | | 438/270 |
| 2013/0240984 A1 | 9/2013 | Cheng et al. | |
| 2013/0334565 A1 | 12/2013 | Hutzler et al. | |
| 2016/0049486 A1 | 2/2016 | Blank et al. | |
| 2017/0222037 A1* | 8/2017 | Kishi | H01L 29/435 |

FOREIGN PATENT DOCUMENTS

| | | |
|---|---|---|
| JP | 2007-165380 A | 6/2007 |
| JP | 2007-529115 A | 10/2007 |
| JP | 2010-153864 A | 7/2010 |
| JP | 2012-64641 A | 3/2012 |
| JP | 2013-69852 A | 4/2013 |
| WO | 2005/065385 A2 | 7/2005 |

OTHER PUBLICATIONS

International Preliminary Report on Patentability in PCT/JP2016/060855, dated Aug. 24, 2017, 4pp.

Search Report in NL Application No. 2018616, dated Nov. 30, 2017, 11pp.

* cited by examiner

US 10,707,343 B2

METHOD OF MANUFACTURING SEMICONDUCTOR DEVICE AND SEMICONDUCTOR DEVICE

RELATED APPLICATIONS

The present application is a National Phase of International Application Number PCT/JP2016/060855, filed Mar. 31, 2016.

TECHNICAL FIELD

The present invention relates to a method of manufacturing a semiconductor device and a semiconductor device.

BACKGROUND ART

Conventionally, there has been known a semiconductor device which includes a shield gate structure of an in-plane direction separation type where a gate electrode and a shield electrode are separated from each other in an in-plane direction (see patent literature 1, for example).

As shown in FIG. 14A to FIG. 17C, the conventional semiconductor device 900 can be manufactured by carrying out the following method (a conventional method of manufacturing a semiconductor device). That is, the conventional semiconductor device 900 can be manufactured by carrying out (1) a semiconductor base body preparing step of preparing a semiconductor base body 910 having an $n^+$-type first semiconductor layer 912 and an $n^-$-type second semiconductor layer 914 having lower concentration than the first semiconductor layer 912 (see FIG. 14A), (2) a first trench forming step of forming a predetermined first trench 916 on the second semiconductor layer 914 (see FIG. 14B), (3) a first insulation film forming step of forming a first insulation film 926 in the inside of the first trench 916 by a thermal oxidation method under a condition that a first gap 922 remain at the center in the inside of the first trench 916 (see FIG. 14C), (4) a shield electrode forming step of forming a shield electrode 924 in the inside of the first gap 922 (see FIG. 14D and FIG. 15A), (5) a first insulation film etching back step of etching back the first insulation film 926 while leaving a lower portion of the first trench 916 (see FIG. 15B), (6) a gate insulation film forming step of forming a gate insulation film 918 in the inside of a recessed portion 950 under a condition that a second gap 952 remain in the inside of a recessed portion 950 formed of side walls of the shield electrode 924, side walls of an upper portion of the first trench 916 and an upper surface of the etched-back first insulation film 926 (see FIG. 15C), (7) a gate electrode forming step of forming a gate electrode 920 in the inside of the second gap 952 (see FIG. 15D and FIG. 16A), (8) a dopant region forming step of forming a base region 928, a source region 930 (first conductive-type high-concentration diffusion region) and a $p^+$-type contact region 932 (see FIG. 16B to FIG. 16D), (9) a protective insulation film forming step of forming a protective insulation film 934 on the gate electrode 920 and the gate insulation film 918 (see FIG. 17A), (10) an insulation film removing step of removing insulation films (the gate insulation film and the protective insulation film) formed above the shield electrode 924 (see FIG. 17B), and (11) a source electrode forming step of forming a source electrode 936 such that the source electrode 936 is electrically connected to the shield electrode 924 (see FIG. 17C).

CITATION LIST

Patent Literature

PTL 1: JP-T-2007-529115

SUMMARY OF INVENTION

Technical Problem

However, the conventional method of manufacturing a semiconductor device includes the gate electrode forming step as a step which comes after the shield electrode forming step. As a result, the insulation films (the gate insulation film and the protective insulation film) are formed above the shield electrode 924 by a step which comes before the source electrode forming step (see FIG. 17A). Accordingly, to establish the connection between the shield electrode 924 and the source electrode 936, an insulation film removing step of removing the insulation films (the gate insulation film and the protective insulation film) formed above the shield electrode 924 becomes necessary (see FIG. 17B) and hence, there exists a drawback that the step of establishing connection between the shield electrode 924 and the source electrode 936 becomes cumbersome.

Further, in the conventional method of manufacturing a semiconductor device, in the first insulation film forming step, the first insulation film 926 is formed in the inside of the first trench 916 by a thermal oxidation method under the condition that the first gap 922 remain at the center in the inside of the first trench 916 (see FIG. 14C) and, thereafter, in the sealed electrode forming step, the sealed electrode 924 is formed in the inside of the first gap 922 (see FIG. 14D and FIG. 15A). Accordingly, it is difficult to set a thickness of the insulation film on a sealed electrode bottom portion side (first insulation film) and a thickness of the insulation film on a sealed electrode side portion side (first insulation film) to desired thicknesses thus also giving rise to a drawback that it is difficult to manufacture a semiconductor device with a high degree of freedom in designing the semiconductor device.

The present invention has been made to overcome the above-mentioned drawbacks, and it is an object of the present invention to provide a method of manufacturing a semiconductor device by which a step of establishing the connection between a shield electrode and a source electrode can be simplified, and a semiconductor device can be manufactured with a high degree of freedom in designing the semiconductor device.

It is another object of the present invention to provide a semiconductor device which is manufactured by such a method of manufacturing a semiconductor device.

Solution to Problem

[1] According to an aspect of the present invention, there is provided a method of manufacturing a semiconductor device having a shield gate structure of an in-plane direction separation type where a gate electrode and a shield electrode are separated from each other in an in-plane direction, the method including in the following order: a semiconductor base body preparing step of preparing a semiconductor base body having a first conductive-type first semiconductor layer and a first conductive-type second semiconductor layer having lower concentration than the first semiconductor layer; a first trench forming step of forming a predetermined first trench on the second semiconductor layer; a first insulation film forming step of forming a first insulation film such that the first insulation film is filled in a lower portion of the first trench; a gate insulation film forming step of forming a gate insulation film on a side wall of an upper portion of the first trench; a gate electrode forming step of forming the gate electrode made of polysilicon with the gate insulation film interposed between the upper portion of the first trench and the gate electrode; a second trench forming step of forming a second trench in the inside of the first trench by removing a center portion of the first insulation film by etching; a second insulation film forming step of forming a second insulation film in at least the inside of the second trench under a condition that a gap remain in the inside of the second trench; a shield electrode forming step of forming the shield electrode in the inside of the gap; and a source electrode forming step of forming a source electrode such that the source electrode is electrically connected to the shield electrode.

[2] In the method of manufacturing a semiconductor device of the present invention, it is preferable that, in the second insulation film forming step, the second insulation film be formed such that a thickness of the second insulation film is larger than a thickness of the gate insulation film.

[3] In the method of manufacturing a semiconductor device of the present invention, it is preferable that, in the second insulation film forming step, assuming a thickness of the second insulation film between a bottom of the gap and a bottom of the first trench as D1, a thickness of the first insulation film between a side wall of the gap at a depth position of the bottom of the gap and a side wall of the first trench as d, and a thickness of the second insulation film between the side wall of the gap at the depth position of the bottom of the gap and the side wall of the first trench as D2, the second insulation film be formed such that a relationship of $D1 \leq d+D2$ is satisfied.

[4] In the method of manufacturing a semiconductor device of the present invention, it is preferable that, in the second trench forming step, the second trench be formed such that the second trench reaches a depth position of the first trench.

[5] In the method of manufacturing a semiconductor device of the present invention, it is preferable that, in the second trench forming step, the second trench be formed such that the second trench reaches a depth position deeper than a depth position of the first trench.

[6] In the method of manufacturing a semiconductor device of the present invention, it is preferable that the method further include a second conductive-type diffusion region forming step of forming a second conductive-type diffusion region such that the second conductive-type diffusion region is brought into contact with the bottom of the second trench, between the second trench forming step and the second insulation film forming step.

[7] In the method of manufacturing a semiconductor device of the present invention, it is preferable that, in the second trench forming step, a trench having side surfaces which form a bottom narrowed tapered shape be formed as the second trench.

[8] In the method of manufacturing a semiconductor device of the present invention, it is preferable that the method further include: a base region forming step of forming a second conductive-type base region on a surface of the second semiconductor layer in a region where the first trench is not formed as viewed in a plan view; and a first conductive-type high concentration diffusion region forming step of forming a first conductive-type high concentration diffusion region on a surface of the base region such that at least a portion of the first conductive-type high concentration diffusion region is exposed on the side wall of the first trench, between the gate electrode forming step and the second trench forming step.

[9] In the method of manufacturing a semiconductor device of the present invention, it is preferable that the method further include: a contact region forming step of forming a second conductive-type contact region in a predetermined region of a surface of the base region between the gate electrode forming step and the second trench forming step; and a second insulation film etching back step where the second insulation film in a region where the first trench is not formed as viewed in a plan view is removed by etching back between the shield electrode forming step and the source electrode forming step, wherein in the source electrode forming step, the source electrode is formed such that the source electrode is directly connected to the shield electrode, the first conductive-type high concentration diffusion region and the contact region.

[10] In the method of manufacturing a semiconductor device of the present invention, it is preferable that the method further include: an opening forming step of forming a predetermined opening in the second insulation film; and a metal plug forming step of forming a metal plug by filling the inside of the opening with metal between the shield electrode forming step and the source electrode forming step, wherein in the source electrode forming step, the source electrode be formed such that the source electrode is directly connected to the shield electrode and is connected to the first conductive-type high concentration diffusion region and the base region through the metal plug.

[11] In the method of manufacturing a semiconductor device of the present invention, it is preferable that, in the first insulation film forming step, the first insulation film be formed by a CVD method.

[12] In the method of manufacturing a semiconductor device of the present invention, it is preferable that, in the first insulation film forming step, the first insulation film be formed by a thermal oxidation method.

[13] In the method of manufacturing a semiconductor device of the present invention, it is preferable that, in the second insulation film forming step, the second insulation film be formed by a CVD method.

[14] In the method of manufacturing a semiconductor device of the present invention, it is preferable that, in the second insulation film forming step, the second insulation film be formed by a thermal oxidation method.

[15] According to another aspect of the present invention, there is provided a semiconductor device having a shield gate structure of an in-plane direction separation type where a gate electrode and a shield electrode are separated from each other in an in-plane direction, the semiconductor device including: a semiconductor base body having a first conductive-type first semiconductor layer and a first conductive-type second semiconductor layer having lower concentration than the first semiconductor layer; a predetermined trench positioned on a surface of the second semiconductor layer; the gate electrode made of polysilicon and formed on a side wall of an upper portion of the trench with a gate insulation film interposed between the gate electrode and the side wall; the shield electrode formed on a center portion of the trench in a state where the shield electrode is spaced apart from the gate electrode; and an insulation region configured to expand between the gate electrode and the shield electrode in the inside of the trench so as to make the shield electrode spaced apart from the gate electrode, and configured to expand along side walls and a bottom of the trench so as to make the shield electrode spaced apart from the side walls and the bottom of the trench, wherein a thickness of the insulation region interposed between the gate electrode and the shield electrode is set larger than a thickness of the gate insulation film.

Advantageous Effects of Invention

According to the method of manufacturing a semiconductor device of the present invention, the method includes the shield electrode forming step as a step which comes after the gate electrode forming step and hence, the insulation films (for example, the gate insulation film and the protective insulation film) are not formed above the shield electrode by a step which comes before the source electrode forming step. Accordingly, an insulation film removing step of removing the insulation films (the gate insulation film and the protective insulation film) becomes unnecessary and hence, a step of establishing the connection between the shield electrode and the source electrode can be simplified.

According to the method of manufacturing a semiconductor device of the present invention, the second trench is formed in the inside of the first trench by removing the center portion of the first insulation film by etching and, thereafter, the second insulation film is formed in the inside of the second trench under the condition that the gap remain in the inside of the second trench. Accordingly, a thickness of the insulation film (second insulation film) on a shield electrode bottom portion side and thicknesses of the insulation films (the first insulation film and the second insulation film) on a shield electrode side portion side can be easily set to desired thicknesses. As a result, the semiconductor device can be manufactured at a high degree of freedom in designing the semiconductor device.

According to the semiconductor device of the present invention, the thickness of the insulation region interposed between the gate electrode and the shield electrode is set larger than the thickness of the gate insulation film and hence, a withstand voltage between the gate electrode and the shield electrode can be increased compared to conventional semiconductor devices.

BRIEF DESCRIPTION OF DRAWINGS

FIG. 1A and FIG. 1B are views for describing a semiconductor device 100 of an embodiment 1, wherein FIG. 1A is an enlarged cross-sectional view (hereinafter simply referred to as a cross-sectional view) of an essential part of the semiconductor device 100 and FIG. 1B is an enlarged plan view (hereinafter simply referred to as a plan view) of the essential part of the semiconductor device 100 (a source electrode 136, a source region 130 and a contact region 132 not shown in FIG. 1B for the sake of brevity of explanation);

DESCRIPTION OF EMBODIMENTS

Figure 1A:
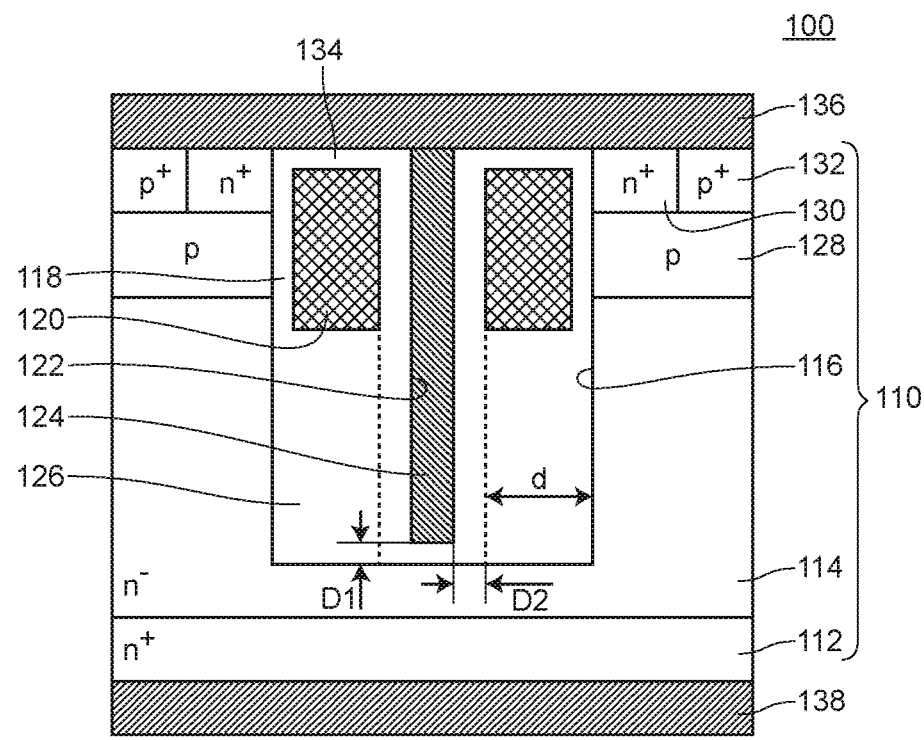

Hereinafter, a method of manufacturing a semiconductor device and a semiconductor device according to the present invention are described in accordance with embodiments shown in the drawings. The respective drawings are schematic views and hence, the drawings do not always strictly reflect actual sizes.

Embodiment 1

1. Configuration of Semiconductor Device 100 According to Embodiment 1

The semiconductor device 100 of the embodiment 1 is a power MOSFET having a shield gate structure of an in-plane direction separation type where a gate electrode and a shield electrode are separated from each other in an in-plane direction.

Figure 1B:
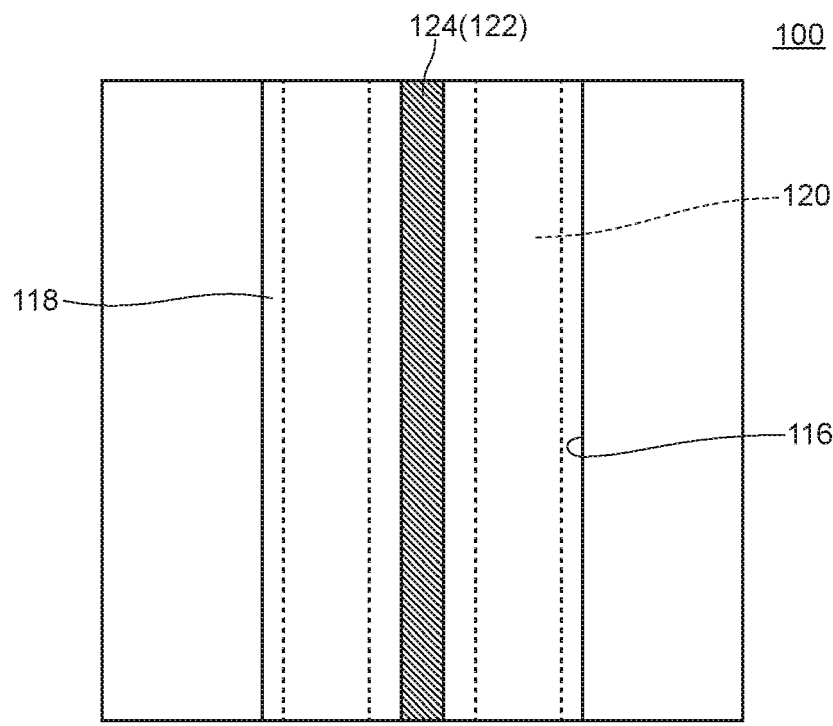

As shown in FIG. 1A and FIG. 1B, the semiconductor device 100 of the embodiment 1 includes: a semiconductor base body 110 having an $n^+$-type first semiconductor layer 112 and an $n^-$-type second semiconductor layer 114 having lower concentration than the $n^+$-type first semiconductor layer 112; a predetermined trench 116 (first trench) positioned on a surface of the second semiconductor layer 114; a gate electrode 120 made of polysilicon and formed on a side wall of an upper portion of the trench 116 with a gate insulation film 118 interposed between the gate electrode 120 and the side wall; a shield electrode 124 formed on the center portion of the trench 116 in a state where the shield electrode 124 is spaced apart from the gate electrode 120; an insulation region 126 configured to expand between the gate electrode 120 and the shield electrode 124 in the inside of the trench 116 so as to make the shield electrode 124 spaced apart from the gate electrode 120, and configured to expand along side walls and a bottom of the trench 116 so as to make the shield electrode 124 spaced apart from the side walls and the bottom of the trench 116; a base region 128 formed on a surface of the second semiconductor layer 114 in a region where the trench 116 is not formed as viewed in a plan view; a source region 130 (first conductive-type high concentration diffusion region) having a portion thereof exposed to the side wall of the trench 116 formed on the surface of the base region 128; a $p^+$-type contact region 132 formed on a predetermined region of a surface of the based region 128 (a region where the source region 130 is not formed); a source electrode 136 directly disposed on a surface of the shield electrode 124, disposed on a surface of the gate electrode 120 with a protective insulation film 134 interposed therebetween, and directly connected to the shield electrode 124, the source region 130 and the contact region 132; and a drain electrode 138 formed on a surface of the first semiconductor layer 112.

In the semiconductor device 100 of the embodiment 1, a thickness of the insulation region 126 interposed between the gate electrode 120 and the shield electrode 124 is set larger than a thickness of the gate insulation film 118.

In the semiconductor device 100 of the embodiment 1, assuming a thickness of the insulation region 126 between a bottom of the shield electrode 124 and a bottom of the trench 116 as D1, and a thickness of the insulation region 126 between a side wall of the shield electrode 124 at a depth position of the bottom of the shield electrode 124 and a side wall of the trench 116 (a total depth of a thickness of a first insulation film 126a described later and a thickness of a second insulation film 126b described later) as d+D2, a relationship of D1<d+D2 is satisfied.

In the embodiment 1, all of the trench 116, the gate electrode 120, the base region 128, the source region 130 and the contact region 132 are formed in a stripe shape (see FIG. 1B).

A thickness of the first semiconductor layer 112 is set to a value which falls within a range of from 50 µm to 500 µm (for example, 350 µm), and dopant concentration of the first semiconductor layer 112 is set to a value which falls within a range of from $1\times10^{18}$ cm$^{-3}$ to $1\times10^{21}$ cm$^{-3}$ (for example, $1\times10^{19}$ cm$^{-3}$). A thickness of the second semiconductor layer 114 in a region where the trench 116 is not formed is set to a value which falls within a range of from 3 µm to 50 µm (for example, 15 µm), and dopant concentration of the second semiconductor layer 114 is set to a value which falls within a range of from $1\times10^{14}$ cm$^{-3}$ to $1\times10^{19}$ cm$^{-3}$ (for example, $1\times10^{15}$ cm$^{-3}$). A thickness of the base region 128 is set to a value which falls within a range of from 0.5 µm to 10 µm (for example, 5 µm), and dopant concentration of the base region 128 is set to a value which falls within a range of from $1\times10^{16}$ cm$^{-3}$ to $1\times10^{19}$ cm$^{-3}$ (for example, $1\times10^{17}$ cm$^{-3}$).

A depth of the trench 116 is set to a value which falls within a range of from 1 µm to 20 µm (for example, 10 µm), a pitch of the trenches 116 is set to a value which falls within a range of from 3 µm to 20 µm (for example, 10 µm), and an opening width of the trench 116 is set to a value which falls within a range of from 0.3 µm to 19 µm (for example, 7 µm). The gate insulation film 118 is formed of a silicon dioxide film which is formed by, for example, a thermal oxidation method, and a thickness of the gate insulation film 118 is set to a value which falls within a range of from 20 nm to 200 nm (for example, 100 nm). The gate electrode 120 is made of polysilicon of low resistance formed by a CVD method, for example, and a thickness of the gate electrode 120 is set to a value which falls within a range of from 0.1 µm to 5 µm (for example, 2 µm).

A distance between the shield electrode 124 and the gate electrode 120 is set to a value which falls within a range of from 0.02 µm to 3 µm (for example, 1 µm), and a distance between the shield electrode 124 and a bottom of the trench 116 is set to a value which falls within a range of from 0.1 µm to 3 µm (for example, 2 µm), and a distance between the shield electrode 124 and a side wall of the trench 116 at a depth position of the bottom of the shield electrode 124 is set to a value which falls within a range of from 0.1 µm to 8 µm (for example, 3 µm). A depth position of an upper surface of the shield electrode 124 with respect to the protective insulation film 134 is set to a value which falls within a range of from 0.01 µm to 2 µm.

A depth of the source region 130 is set to a value which falls within a range of from 1 µm to 3 µm (for example, 2 µm), and dopant concentration of the source region 130 is set to a value which falls within a range of from $1\times10^{18}$ cm$^{-3}$ to $1\times10^{20}$ cm$^{-3}$ (for example, $2\times10^{19}$ cm$^{-3}$). A depth of the contact region 132 is set to a value which falls within a range of from 1 µm to 3 µm (for example, 2 µm), and dopant concentration of the contact region 132 is set to a value which falls within a range of from $1\times10^{18}$ cm$^{-3}$ to $1\times10^{20}$ cm$^{-3}$ (for example, $2\times10^{19}$ cm$^{-3}$). The protective insulation film 134 is, for example, formed of a silicon dioxide film which is formed by a CVD method, and a thickness of the protective insulation film 134 is set to a value which falls within a range of from 0.5 µm to 3 µm (for example, 1 µm).

The source electrode 136 is formed of, for example, an Al film or an Al alloy film (for example, AlSi film), and a thickness of the source electrode 136 is set to a value which falls within a range of from 1 µm to 10 µm (for example, 3 µm). The drain electrode 138 is formed of a stacked film formed by stacking a Ti layer, an Ni layer and an Au layer in this order, and a thickness of the drain electrode 138 is set to a value which falls within a range of from 0.2 µm to 1.5 µm (for example, 1 µm).

2. Advantageous Effects Acquired by Semiconductor Device 100 of Embodiment 1

According to the semiconductor device 100 of the embodiment 1, the thickness of the insulation region 126 interposed between the gate electrode 120 and the shield electrode 124 is set larger than the thickness of the gate insulation film 118 and hence, a withstand voltage between the gate electrode 120 and the shield electrode 124 can be increased compared to the conventional semiconductor device 900.

3. Method of Manufacturing Semiconductor Device of Embodiment 1

The semiconductor device 100 of this embodiment 1 can be manufactured by a manufacturing method having the following steps (the method of manufacturing a semiconductor device of the embodiment 1).

(1) Semiconductor Base Body Preparing Step

Figure 2A:
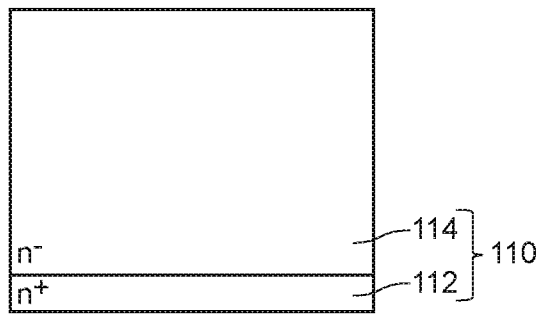
FIG. 2A to FIG. 2D are cross-sectional views for describing respective steps of a method of manufacturing a semiconductor device of the embodiment 1.

First, a semiconductor base body 110 having an $n^+$-type first semiconductor layer 112 and an $n^-$-type second semiconductor layer 114 having lower concentration than the first semiconductor layer 112 is prepared (see FIG. 2A). A suitable semiconductor base body can be used as the semiconductor base body 110. For example, a semiconductor base body can be used where an $n^-$-type second semiconductor layer 114 is formed on an $n^+$-type first semiconductor layer 112 by an epitaxial growth method. Although a semiconductor base body made of silicon is used as the semiconductor base body 110 in the embodiment 1, a semiconductor base body made of a material other than silicon may be used as the semiconductor base body 110.

(2) First Trench Forming Step

Figure 2B:
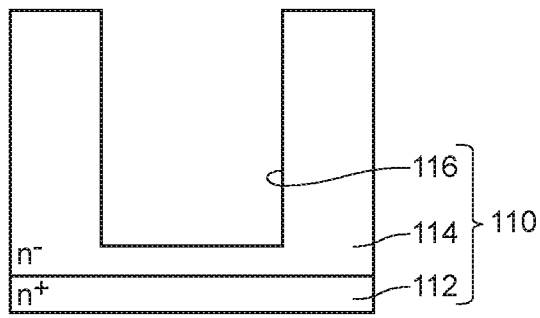

Next, a predetermined first trench 116 is formed on the second semiconductor layer 114 in such a manner that a mask having a predetermined opening (not shown in the drawing) is formed on a surface of the second semiconductor layer 114, and the predetermined first trench 116 is formed by etching the second semiconductor layer 114 using the mask (see FIG. 2B).

(3) First Insulation Film Forming Step

Figure 2C:
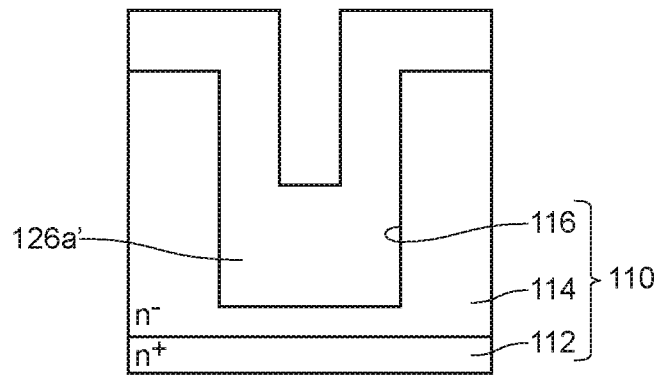
Figure 2D:
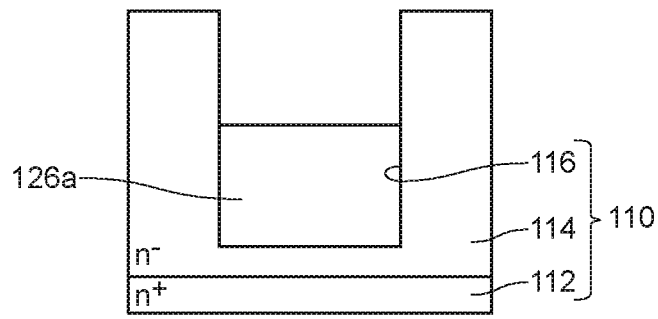

Next, a silicon oxide film 126a' having a predetermined thickness is formed on a surface of the second semiconductor layer 114 (including the inside of the first trench 116) by a CVD method (see FIG. 2C). A thickness of the silicon oxide film 126a' is set to a value which falls within a range of from 0.5 µm to 5 µm, for example. Next, a first insulation film 126a is formed such that the silicon oxide film 126a' other than the lower portion of the first trench 116 is removed by etching back so that the first insulation film 126a is formed so as to be filled in a lower portion of the first trench 116 (see FIG. 2D).

(4) Gate Insulation Film Forming Step

Figure 3A:
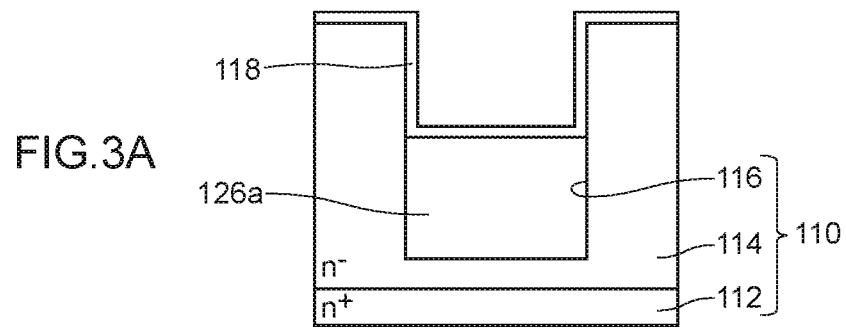
FIG. 3A to FIG. 3D are cross-sectional views for describing respective steps of the method of manufacturing a semiconductor device of the embodiment 1.

Next, a silicon oxide film is formed on surfaces of side walls of an upper portion of the first trench 116 and surfaces of the first insulation film 126a and the second semiconductor layer 114 (including the surfaces of the side walls of the upper portion of the first trench 116) by a thermal oxidation method (see FIG. 3A). The silicon oxide film formed on the side walls of the upper portion of the first trench 116 forms the gate insulation film 118. A thickness of the gate insulation film 118 is set to a value which falls within a range of from 20 nm to 200 nm, for example.

(5) Gate Electrode Forming Step

Figure 3B:
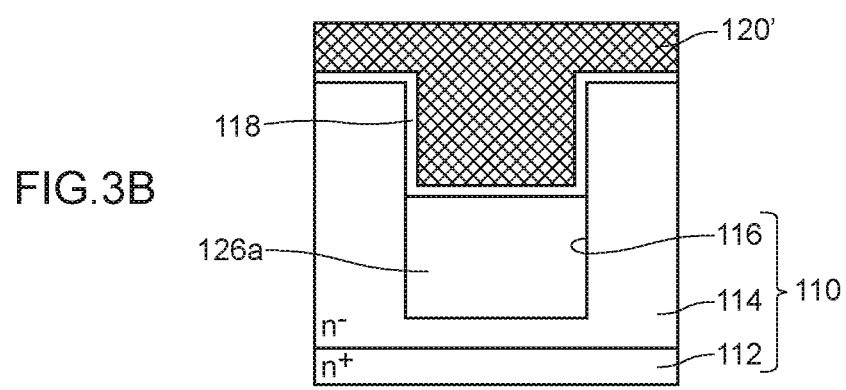
Figure 3C:
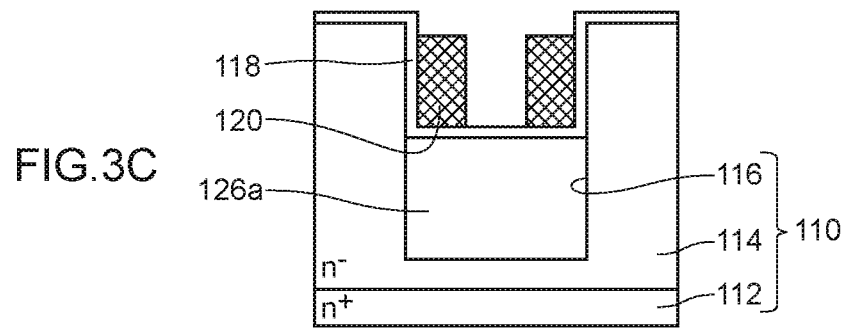

Next, a polysilicon layer 120' is formed on a surface of the silicon oxide film by a CVD method (see FIG. 3B). Then, gate electrodes 120 made of polysilicon are formed by etching back the polysilicon layer 120' (see FIG. 3C). In the gate electrode layer forming step, the polysilicon layer 120' is etched back such that the gate electrodes 120 are formed at positions spaced apart from each other with a predetermined distance therebetween in the inside of the first trench 116.

(6) Steps of Forming Base Regions 128, Source Regions 130 and Contact Regions 132

Figure 3D:
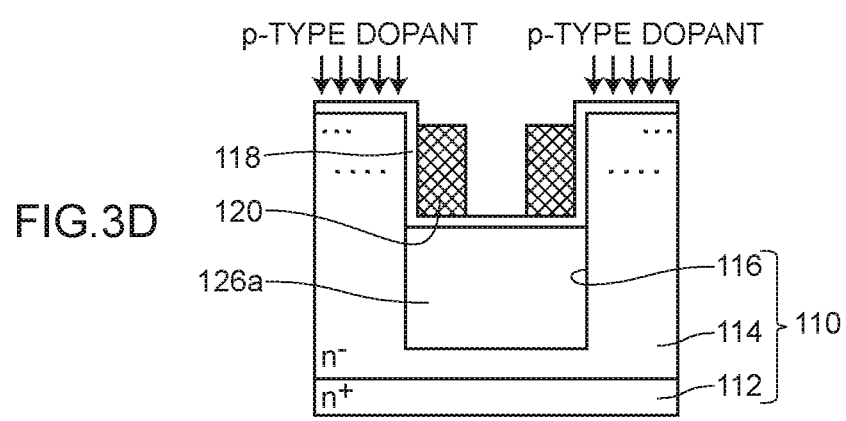
Figure 4A:
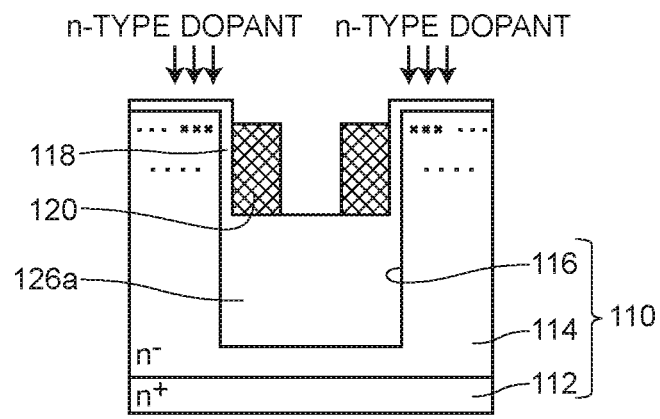
FIG. 4A to FIG. 4D are cross-sectional views for describing respective steps of the method of manufacturing a semiconductor device of the embodiment 1.
Figure 4B:
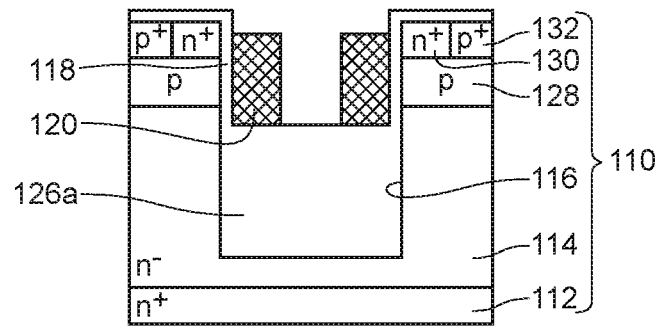

Next, p-type dopant (for example, boron) is injected by ion implantation into a surface of the second semiconductor layer 114 in regions where the first trench 116 is not formed as viewed in a plan view. Then, a mask having openings corresponding to contact regions 132 (not shown in the drawing) is formed on the second semiconductor layer 114, and a p-type dopant (for example, boron) is injected by ion implantation into a shallower depth position with higher dopant concentration by means of the mask (see FIG. 3D). Next, a mask having openings corresponding to the source regions 130 (not shown in the drawing) is formed on the surface of the second semiconductor layer 114, and an n-type dopant (for example, phosphorus) is injected by ion implantation to the surface of the second semiconductor layer 114 by means of the mask (see FIG. 4A). Then, by thermally diffusing the p-type dopant and the n-type dopant injected into the second semiconductor layer 114 by ion implantation, the base regions 128, the source regions 130 and the contact regions 132 are formed (see FIG. 4B).

(7) Second Trench Forming Step

Figure 4C:
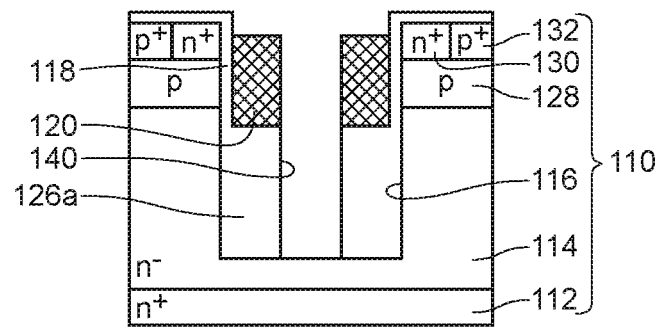

Next, a mask having an opening at a center portion of the first insulation film 126a (not shown in the drawing) is formed, and a second trench 140 is formed in the first trench 116 by removing the center portion of the first insulation film 126a by etching using the mask (see FIG. 4C). An opening width of the second trench 140 is equal to a distance between two gate electrodes 120 in the first trench 116 and, for example, the opening width is set to a value which falls within a range of from 0.1 µm to 5 µm.

In the second trench forming step, the second trench 140 is formed such that the second trench 140 reaches a depth position of the first trench 116.

(8) Second Insulation Film Forming Step

Figure 4D:
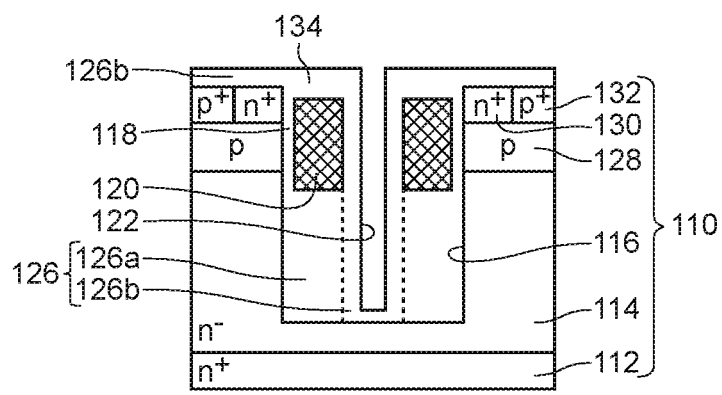

Next, a second insulation film 126b is formed by a thermal oxidation method in the second trench 140 under a condition that a gap remain in the second trench 140 (see FIG. 4D). In this step, the second insulation film 126b is also formed on the region of the second semiconductor layer 114 where the first trench 116 is not formed and a surface of the gate electrode 120. The first insulation film 126a and the second insulation film 126b form an insulation region 126, and the second insulation film 126b on the gate electrode 120 forms a protective insulation film 134.

In the second insulation film forming step, the second insulation film 126b is formed such that a thickness of the second insulation film 126b is larger than a thickness of the gate insulation film 118. The thickness of the second insulation film 126b is set to a value which falls within a range of from 0.2 µm to 5 µm. A depth of a gap 122 is set to a value which falls within a range of from 0.5 µm to 19 µm, and an opening width of the gap 122 is set to a value which falls within a range of from 0.1 µm to 5 µm.

In the second insulation film forming step, assuming a thickness of the second insulation film 126b between a bottom of the gap 122 and a bottom of the first trench 116 as D1, a thickness of the first insulation film 126a between a side wall of the gap 122 at a depth position of the bottom of the gap 122 and a side wall of the first trench 116 as d, and a thickness of the second insulation film 126b between the side wall of the gap 122 at the depth position of the bottom of the gap 122 and the side wall of the first trench 116 as D2, the second insulation film 126b is formed such that a relationship of D1<d+D2 is satisfied (see FIG. 1A and FIG. 1B with respect to symbols D1, D2, d).

(9) Shield Electrode Forming Step

Figure 5A:
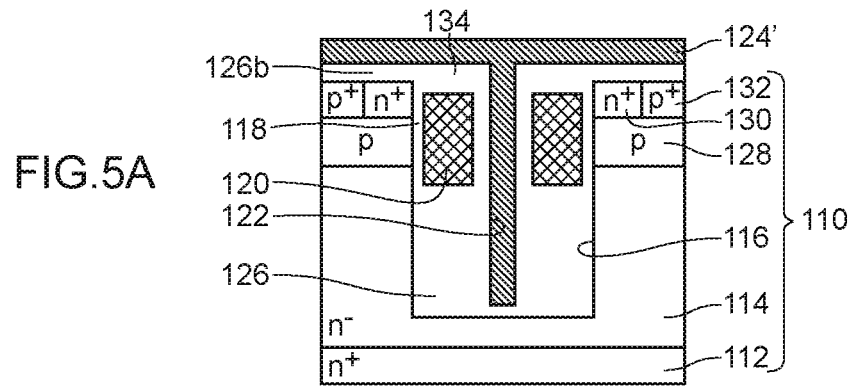
FIG. 5A to FIG. 5D are cross-sectional views for describing respective steps of the method of manufacturing a semiconductor device of the embodiment 1.
Figure 5B:
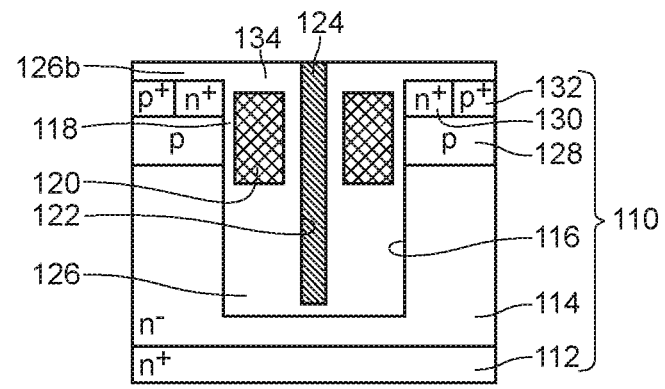

Next, a polysilicon layer 124' is formed on the whole region of the surface of the semiconductor base body 110 on a second semiconductor layer 114 side (see FIG. 5A). Then, a shield electrode 124 is formed by removing the polysilicon layer 124' in a region other than the inside of the gap 122 by etching back (see FIG. 5B).

(10) Second Insulation Film Etching Back Step

Figure 5C:
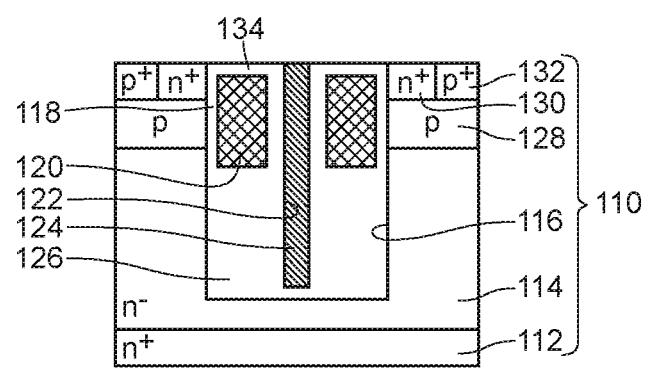

Next, the second insulation film 126b in the region where the first trench 116 is not formed as viewed in a plan view is removed by etching back until etching reaches a surface of the second semiconductor layer 114 (see FIG. 5C). In this step, the protective insulation film 134 on the gate electrode 120 is also removed until etching reaches the surface of the second semiconductor layer 114.

(11) Source Electrode and Drain Electrode Forming Step

Figure 5D:
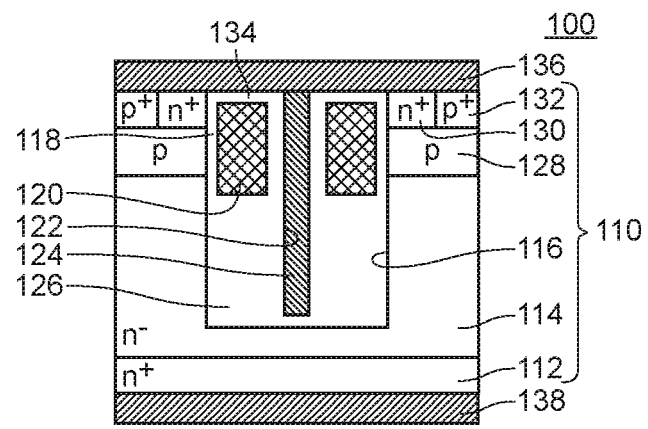

Next, a source electrode 136 is formed on surfaces of the source regions 130, the contact regions 132, the shield electrode 124 and the protective insulation films 134 such that the source electrode 136 is directly connected to the shield electrode 124, the source regions 130 and the contact regions 132. A drain electrode 138 is formed on a surface of the first semiconductor layer 112 (see FIG. 5D).

The semiconductor device 100 of the embodiment 1 can be manufactured in accordance with the above-mentioned steps.

4. Advantageous Effects Acquired by Method of Manufacturing a Semiconductor Device of Embodiment 1

According to the method of manufacturing a semiconductor device of the embodiment 1, the method includes the shield electrode forming step as a step which comes after the gate electrode forming step and hence, the insulation films (for example, the gate insulation film and the protective insulation film) are not formed above the shield electrode 124 by a step which comes before the source electrode forming step. Accordingly, an insulation film removing step of removing the insulation films becomes unnecessary and hence, a step of establishing the connection between the shield electrode 124 and the source electrode 136 can be simplified.

According to the method of manufacturing a semiconductor device of the embodiment 1, the second trench 140 is formed in the inside of the first trench 116 by removing the center portion of the first insulation film 126a by etching and, thereafter, the second insulation film 126b is formed in the inside of the second trench 140 under the condition that the gap remain in the inside of the second trench 140. Accordingly, a thickness of the insulation film (second insulation film) on a shield electrode bottom portion side and thicknesses of the insulation films (the first insulation film and the second insulation film) on a shield electrode side portion side can be easily set to desired thicknesses. As a result, the semiconductor device can be manufactured at a high degree of freedom in designing the semiconductor device.

It is considered in general that an oxide film formed by thermally oxidizing single crystal silicon and an oxide film formed by thermally oxidizing polysilicon differ from each other in film quality. That is, it is considered that a rate of $SiO_2$ is relatively high in an oxide film formed by thermally oxidizing single crystal silicon, while a rate of $SiO_x$ is also high besides $SiO_2$ in an oxide film formed by thermally oxidizing polysilicon. Accordingly, irregularities are liable to occur in an oxide film formed by thermally oxidizing polysilicon of the gate electrode 120 (an oxide film between the gate electrode 120 and the shield electrode 124) and hence, irregularities are liable to occur in ESD breakdown resistance between the gate electrode 120 and the shield electrode 124.

However, according to the method of manufacturing a semiconductor device of the embodiment 1, as described above, the thickness of the insulation film on the shield electrode bottom portion side (second insulation film) and the thickness of the insulation film on the shield electrode side portion side (the first insulation film and the second insulation film) can be easily set to desired thicknesses and hence, it is possible to manufacture a semiconductor device with small irregularities in ESD breakdown resistance.

According to the method of manufacturing a semiconductor device of the embodiment 1, in the second insulation film forming step, the second insulation film 126b is formed such that a thickness of the second insulation film 126b is larger than a thickness of the gate insulation film 118. Accordingly, a gate-source withstand voltage can be increased compared to the conventional semiconductor device 900.

According to the method of manufacturing a semiconductor device of the embodiment 1, in the second insulation film forming step, assuming a thickness of the second insulation film 126b between a bottom of the gap 122 and a bottom of the first trench 116 as D1, a thickness of the first insulation film 126a between a side wall of the gap 122 at a depth position of the bottom of the gap 122 and a side wall of the first trench 116 as d, and a thickness of the second insulation film 126b between the side wall of the gap 122 at the depth position of the bottom of the gap 122 and the side wall of the first trench 116 as D2, the second insulation film 126b is formed such that a relationship of D1<d+D2 is satisfied (see FIG. 1A and FIG. 1B).

By adopting such a method, it is possible to acquire the following advantageous effects.

(1) The shield electrode 124 can be formed such that the shield electrode 124 reaches a deep depth position and hence, a depletion layer can reach a deep position when a reverse bias is applied. As a result, a source-drain withstand voltage can be increased.

(2) A distance from a corner portion of the first trench 116 where the concentration of an electric field is liable to occur to the gate electrode 120 can be increased and, further, an electric field can be alleviated by the first insulation film 126a and the second insulation film 126b. As a result, a withstand voltage can be increased also from this point of view.

According to the method of manufacturing a semiconductor device of the embodiment 1, in the second trench forming step, the second trench 140 is formed such that the second trench 140 reaches a depth position of the first trench 116. The depth position of the first trench 116 is disposed at a boundary surface between the first insulation film 126a and the second semiconductor layer 114, and a material for forming the first insulation film 126a (material: oxide film) and a material for forming the second semiconductor layer 114 (material: silicon) differ from each other. By adopting the above-mentioned configuration, etching performed in the second trench forming step can be stopped at the depth position of the first trench 116 with high accuracy and hence, the second trench 140 having the uniform depth with high accuracy can be formed.

In the method of manufacturing a semiconductor device of the embodiment 1, in the source electrode forming step, the source electrode 136 is formed such that the source electrode 136 is directly connected to the shield electrode 124, the source region 130 and the contact region 132. Accordingly, a contact area between the source electrode 136, the source region 130 and the contact region 132 can be increased and hence, contact resistance can be decreased.

In the method of manufacturing a semiconductor device of the embodiment 1, in the first insulation film forming step, the first insulation film 126a is formed by a CVD method. Accordingly, the first insulation film 126a can be formed at a relatively low temperature compared to the case where a thermal oxidation method is adopted and hence, damage to the semiconductor base body 110 caused by heating can be reduced.

According to the method of manufacturing a semiconductor device of the embodiment 1, in the second insulation film forming step, the second insulation film 126b is formed by a thermal oxidation method and hence, an insulation film can be formed also in the relatively narrow gap 122.

Embodiment 2

Figure 6:
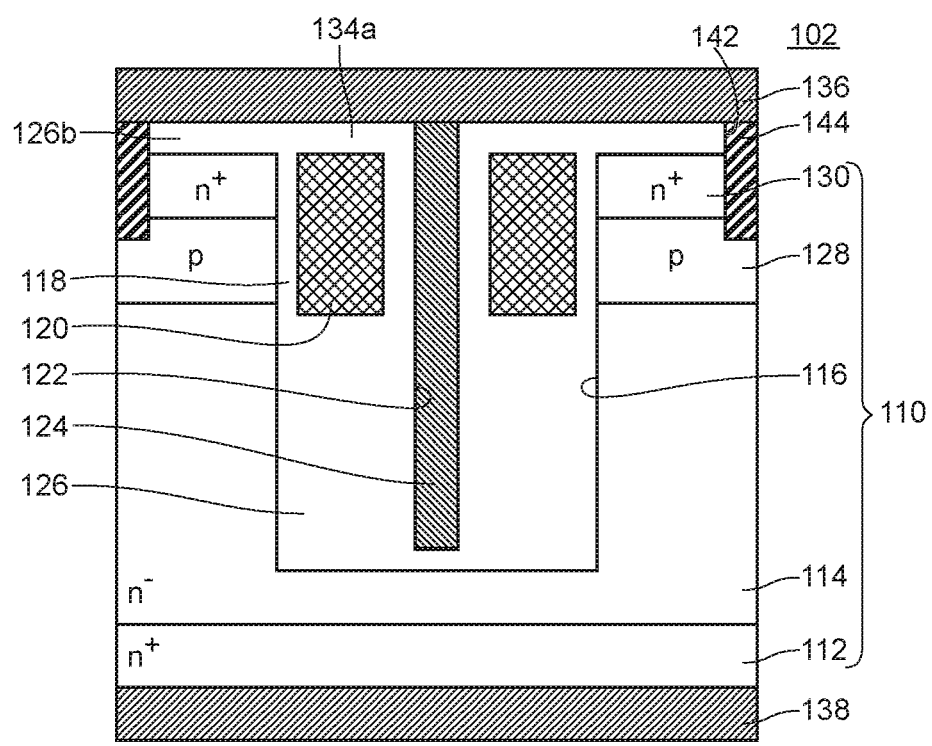
FIG. 6 is a cross-sectional view of a semiconductor device 101 of an embodiment 2.

A semiconductor device 101 of the embodiment 2 basically has substantially the same configuration as the semiconductor device 100 of the embodiment 1. However, the semiconductor device 101 of the embodiment 2 differs from the semiconductor device 100 of the embodiment 1 with respect to a point that a source electrode is connected to a source region through a metal plug. That is, in the semiconductor device 101 of the embodiment 2, as shown in FIG. 6, a second insulation film 126b is formed also between a source electrode 136 and a source region 130, a predetermined opening 142 is formed in the second insulation film 126b, and a metal plug 144 is formed by filling the inside of the opening 142 with metal.

The semiconductor device 101 of the embodiment 2 can be manufactured by a method of manufacturing a semiconductor device of the embodiment 2 described hereinafter.

Figure 7A:
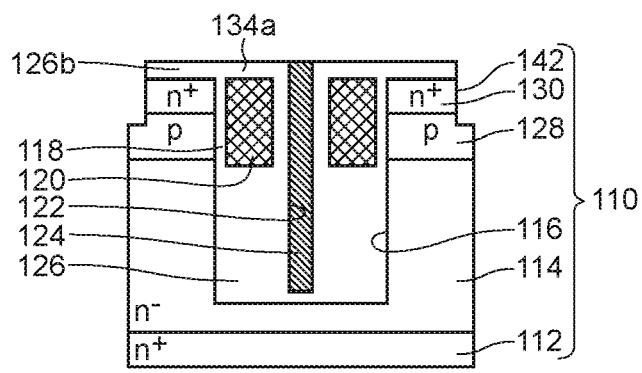
FIG. 7A to FIG. 7C are cross-sectional views for describing respective steps of a method of manufacturing a semiconductor device of the embodiment 2.
Figure 7B:
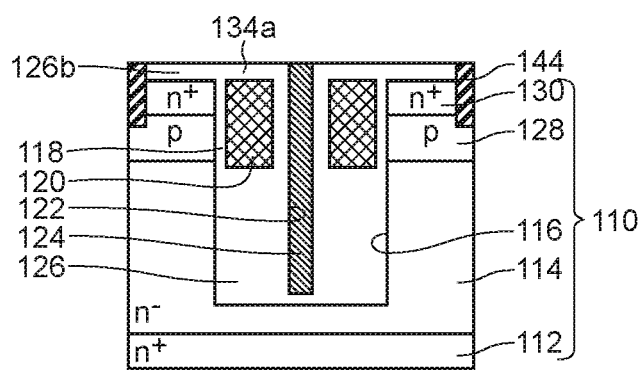

The method of manufacturing a semiconductor device of the embodiment 2 basically has substantially the same steps as the method of manufacturing a semiconductor device of the embodiment 1. However, the method of manufacturing a semiconductor device of the embodiment 2 differs from the method of manufacturing a semiconductor device of the embodiment 1 with respect to a point that the method of the embodiment 2 includes a metal plug forming step. That is, the method of manufacturing a semiconductor device of the embodiment 2, as shown in FIG. 7A to FIG. 7C, further includes: an opening forming step where a predetermined opening 142 is formed in the second insulation film 126b such that the opening 142 reaches the base region 128 (see FIG. 7A); and a metal plug forming step where a metal plug 144 is formed by filling the inside of the opening 142 with metal (see FIG. 7B) between a shield electrode forming step (see FIG. 5B) and a source electrode forming step (see FIG. 5D).

Figure 7C:
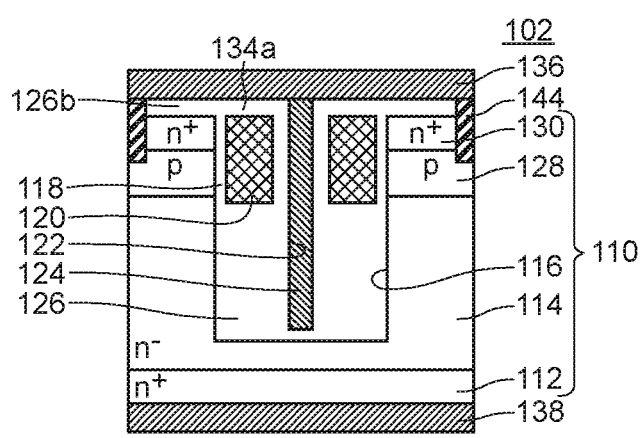

In the source electrode forming step, the source electrode 136 is formed such that the source electrode 136 is directly connected to the shield electrode 124 and is connected to the source region 130 and the base region 128 through the metal plug 144 (see FIG. 7C).

Openings 142 and metal plugs 144 are formed in a stripe shape, and a stripe width is set to 0.5 μm, for example. A barrier metal (not shown in the drawing) is formed on an inner surface of the opening 142, and the metal plug 144 is formed such that the inside of the opening 142 is filled with predetermined metal by way of the barrier metal. Predetermined metal is tungsten, for example.

In this manner, the method of manufacturing a semiconductor device of the embodiment 2 differs from the method of manufacturing a semiconductor device of the embodiment 1 with respect to a point that the method of the embodiment 2 includes a metal plug forming step. However, in the same manner as the method of manufacturing a semiconductor device of the embodiment 1, the method of manufacturing a semiconductor device of the embodiment 2 includes the shield electrode forming step as a step which comes after the gate electrode forming step and hence, the insulation films are not formed above the shield electrode 124 by a step which comes before the source electrode forming step. Accordingly, an insulation film removing step of removing the insulation films becomes unnecessary and hence, a step of establishing the connection between the shield electrode 124 and the source electrode 136 can be simplified.

In the method of manufacturing a semiconductor device of the embodiment 2, the method further includes: the opening forming step of forming a predetermined opening in the second insulation film 126b; and a metal plug forming step of forming the metal plug 144 by filling the inside of the opening 142 with metal between the shield electrode forming step and the source electrode forming step, wherein in the source electrode forming step, the source electrode 136 is formed such that the source electrode 136 is directly connected to the shield electrode 124 and is connected to the source region 130 and the base region 128 through the metal plug 144. Accordingly, unlike the case of a method of manufacturing a semiconductor device where a source electrode and a source region are brought into direct contact with each other, it is unnecessary to form a large opening by removing a large amount of protective insulation film and hence, it is possible to manufacture a downsized semiconductor device. As a result, the method of manufacturing a semiconductor device of the embodiment 2 can manufacture a semiconductor device which satisfies the reduction of cost of electronic equipment and downsizing of electronic equipment.

The method of manufacturing a semiconductor device of the embodiment 2 includes substantially the same steps as the method of manufacturing a semiconductor device of the embodiment 1 with respect to points other than the points including the metal plug forming step and hence, the method of manufacturing a semiconductor device of the embodiment 2 acquires advantageous effects which correspond to advantageous effects out of advantageous effects which the method of manufacturing a semiconductor device of the embodiment 1 can acquire.

Embodiment 3

Figure 8:
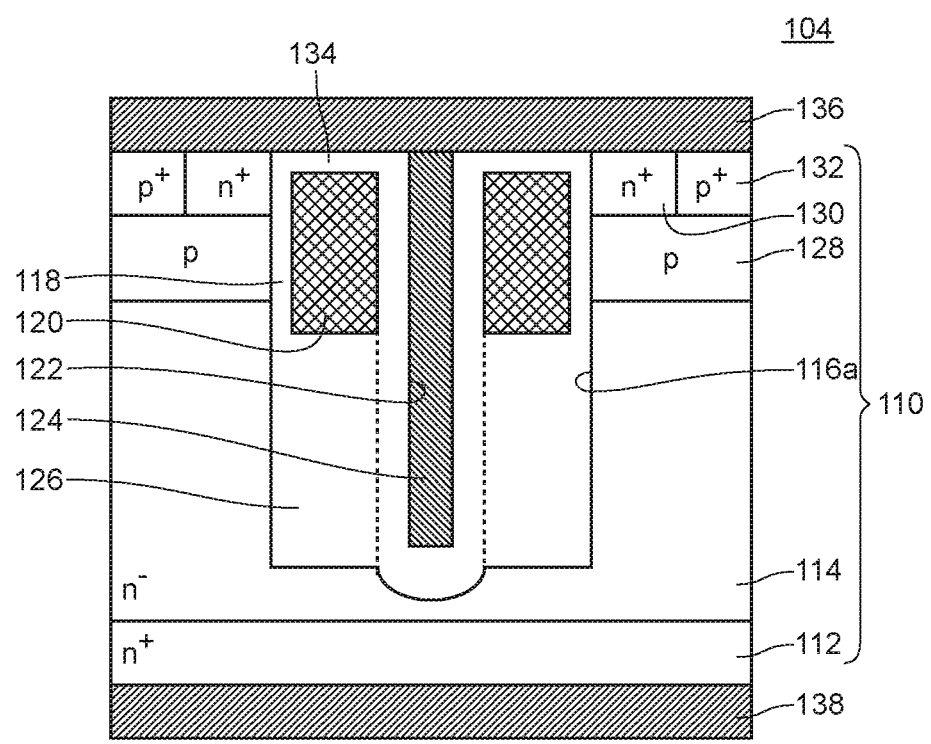
FIG. 8 is a cross-sectional view of a semiconductor device 102 of an embodiment 3.

A semiconductor device 102 of the embodiment 3 basically has substantially the same configuration as the semiconductor device 100 of the embodiment 1. However, the semiconductor device 102 of the embodiment 3 differs from the semiconductor device 100 of the embodiment 1 with respect to a shape of the trench. That is, in the trench 116 of the semiconductor device 102 of the embodiment 3, as shown in FIG. 8, a depth of the trench 116 in a region where a shield electrode 124 is formed as viewed in a plan view is deeper than a depth of the trench 116 in a region where the shield electrode 124 is not formed as viewed in a plan view.

The semiconductor device 102 of the embodiment 3 can be manufactured by a method of manufacturing a semiconductor device of the embodiment 3 described hereinafter.

Figure 9A:
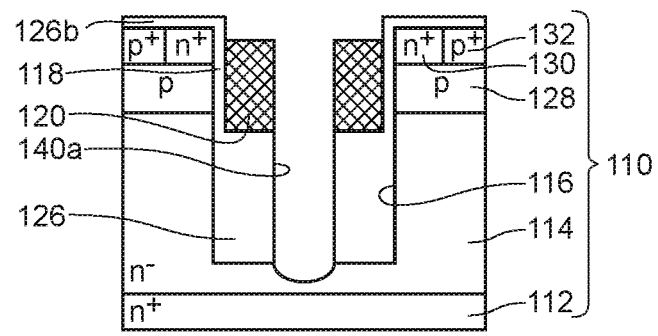
FIG. 9A to FIG. 9C are cross-sectional views for describing respective steps of a method of manufacturing a semiconductor device of the embodiment 3.

The method of manufacturing a semiconductor device of the embodiment 3 basically has substantially the same steps as the method of manufacturing a semiconductor device of the embodiment 1. However, the method of manufacturing a semiconductor device of the embodiment 3 differs from the method of manufacturing a semiconductor device of the embodiment 1 with respect to a depth of the second trench formed in the second trench forming step. That is, in the second trench forming step of the method of manufacturing a semiconductor device of the embodiment 3, as shown in FIG. 9A, a second trench 140a is formed such that the second trench 140a reaches a depth position deeper than a depth position of the first trench 116.

Figure 9B:
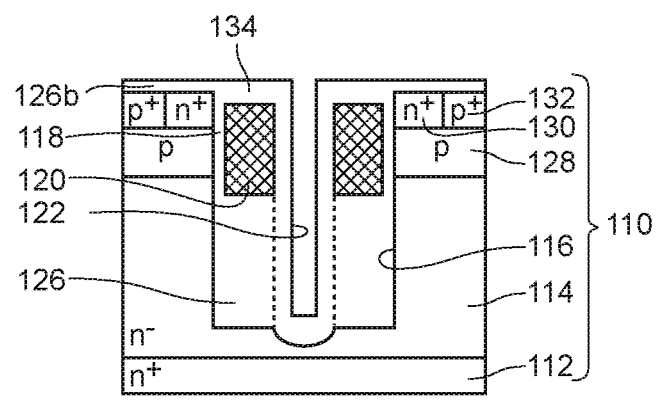

In a second insulation film forming step, a second insulation film 126b is formed also on a surface of the second trench 140a formed at the depth position deeper than the depth position of the first trench 116 (see FIG. 9B).

Figure 9C:
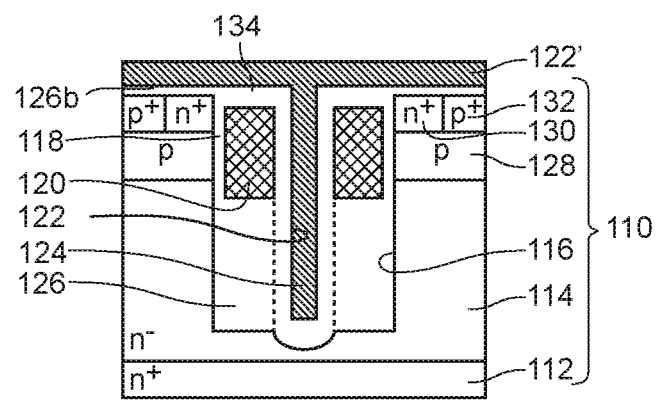

Then, a shield electrode layer forming step is performed (see FIG. 9C).

In this manner, the method of manufacturing a semiconductor device of the embodiment 3 differs from the method of manufacturing a semiconductor device of the embodiment 1 with respect to the depth of the second trench formed in the second trench forming step. However, in the same manner as the method of manufacturing a semiconductor device of the embodiment 1, the method includes the shield electrode forming step as a step which comes after the gate electrode forming step and hence, the insulation films (for example, the gate insulation film and the protective insulation film) are not formed above the shield electrode 124 by a step which comes before the source electrode forming step. Accordingly, an insulation film removing step of removing the insulation films becomes unnecessary and hence, a step of establishing the connection between the shield electrode 124 and the source electrode 136 can be simplified.

According to the method of manufacturing a semiconductor device of the embodiment 3, in the second trench forming step, the second trench 140a is formed such that the second trench 140a reaches a depth position deeper than a depth position of the first trench 116 and hence, the shield electrode 124 can be formed such that the shield electrode 124 reaches a deep depth position. Accordingly, in the manufactured semiconductor device, it is possible to make a depletion layer reach a deep position at the time of applying a reverse bias and hence, a source-drain withstand voltage can be increased.

According to the method of manufacturing a semiconductor device of the embodiment 3, in the second trench forming step, the second trench 140a is formed such that the second trench 140a reaches a depth position deeper than a depth position of the first trench 116. Accordingly, it is unnecessary to control etching to stop the etching at the depth position of the first trench 116 with high accuracy whereby a semiconductor device can be manufactured relatively easily.

According to the semiconductor device 102 of the embodiment 3, a depth of the trench 116 in a region where a shield electrode 124 is formed as viewed in a plan view is deeper than a depth of the trench 116 in a region where the shield electrode 124 is not formed as viewed in a plan view and hence, the shield electrode 124 can be formed such that the shield electrode 124 reaches a deep depth position. Accordingly, it is possible to make a depletion layer reach a deep position at the time of applying a reverse bias and hence, a source-drain withstand voltage can be increased.

The method of manufacturing a semiconductor device of the embodiment 3 includes substantially the same steps as the method of manufacturing a semiconductor device of the embodiment 1 with respect to points other than a depth of the second trench formed in the second trench forming step and hence, the method of manufacturing a semiconductor device of the embodiment 3 acquires advantageous effects which correspond to advantageous effects out of advantageous effects which the method of manufacturing a semiconductor device of the embodiment 1 can acquire.

Embodiment 4

Figure 10:
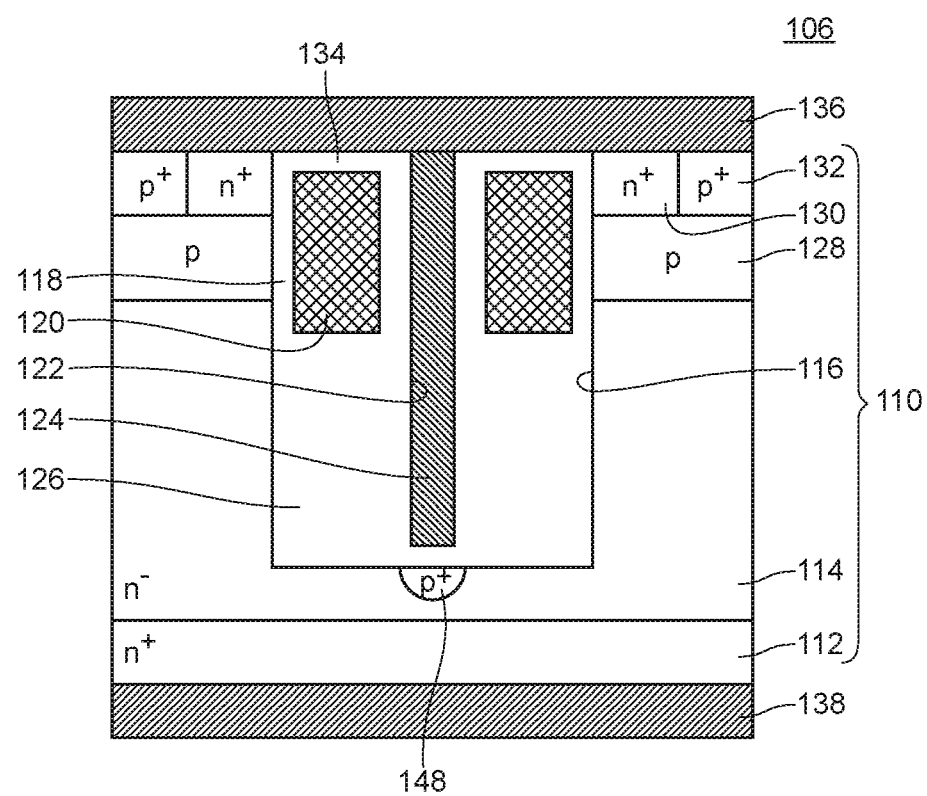
FIG. 10 is a cross-sectional view of a semiconductor device 103 of an embodiment 4.

A semiconductor device 103 of the embodiment 4 basically has substantially the same configuration as the semiconductor device 100 of the embodiment 1. However, the semiconductor device 103 of the embodiment 4 differs from the semiconductor device 100 of the embodiment 1 with respect to a point that the semiconductor device 103 further includes a p-type diffusion region. That is, in the semiconductor device 103 of the embodiment 4, as shown in FIG. 10, a p-type diffusion region 148 (second conductive-type diffusion region) is formed such that the p-type diffusion region 148 is brought into contact with a bottom of the trench 116. Dopant concentration of the p-type diffusion region 148 is set higher than dopant concentration of the base region 128.

The semiconductor device 103 of the embodiment 4 can be manufactured by a method of manufacturing a semiconductor device of the embodiment 4 described hereinafter.

Figure 11A:
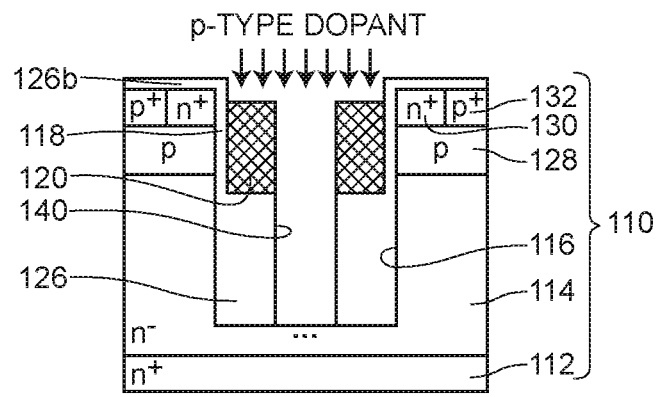
FIG. 11A to FIG. 11C are cross-sectional views for describing respective steps of a method of manufacturing a semiconductor device of the embodiment 4.
Figure 11B:
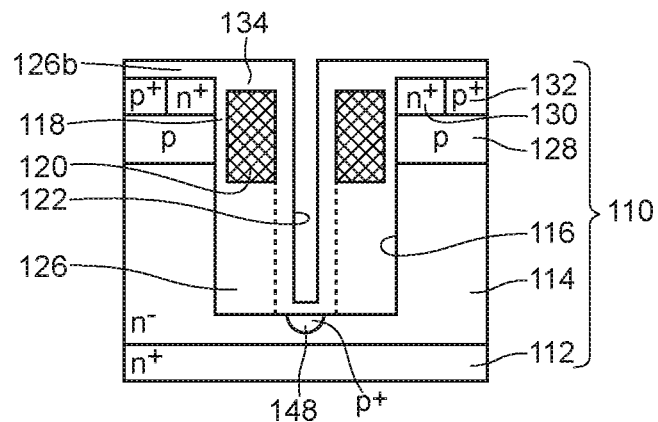

The method of manufacturing a semiconductor device of the embodiment 4 basically has substantially the same steps as the method of manufacturing a semiconductor device of the embodiment 1. However, the method of manufacturing a semiconductor device of the embodiment 4 differs from the method of manufacturing a semiconductor device of the embodiment 1 with respect to a point that the method of manufacturing a semiconductor device of the embodiment 4 includes a p-type diffusion region forming step. That is, the method of manufacturing a semiconductor device of the embodiment 4, as shown in FIG. 11A and FIG. 11B, further includes the p-type diffusion region forming step (second conductive-type diffusion region forming step) of forming the p-type diffusion region 148 where the p-type diffusion region 148 is formed such that the p-type diffusion region 148 is brought into contact with a bottom of the second trench 140 between a second trench forming step (see FIG. 4C) and a second insulation film forming step (see FIG. 4D).

Figure 11C:
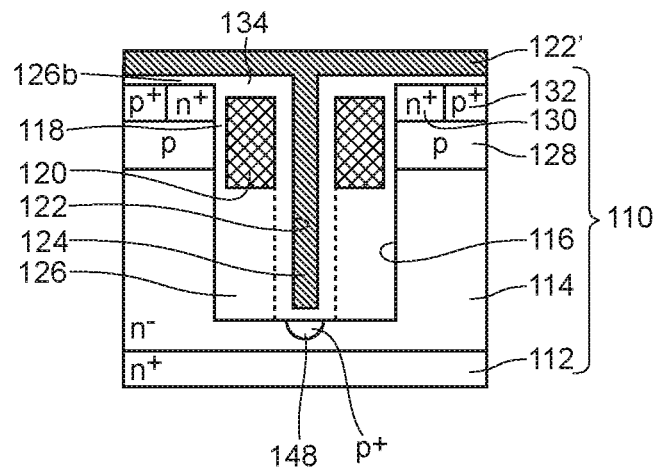

To be more specific, after performing the second trench forming step (see FIG. 4C), the p-type diffusion region 148 is formed by injecting a p-type dopant into the bottom of the second trench 140 (see FIG. 11A) and by activating the p-type dopant. Then, the second insulation film forming step (see FIG. 11B) and a shield electrode forming step (see FIG. 11C) are performed.

In this manner, the method of manufacturing a semiconductor device of the embodiment 4 differs from the method of manufacturing a semiconductor device of the embodiment 1 with respect to the point that the method of the embodiment 4 includes the p-type diffusion region forming step. However, in the same manner as the method of manufacturing a semiconductor device of the embodiment 1, the method of the embodiment 4 includes the shield electrode forming step as a step which comes after the gate electrode forming step and hence, the insulation films (for example, the gate insulation film and the protective insulation film) are not formed above the shield electrode 124 by a step which comes before the source electrode forming step. Accordingly, an insulation film removing step of removing the insulation films becomes unnecessary and hence, a step of establishing the connection between the shield electrode 124 and the source electrode 136 can be simplified.

The method of manufacturing a semiconductor device of the embodiment 4 includes the p-type diffusion region forming step of forming the p-type diffusion region 148 where the p-type diffusion region 148 is formed such that the p-type diffusion region 148 is brought into contact with a bottom of the second trench 140 between the second trench forming step and the second insulation film forming step. Accordingly, it is possible to make a depletion layer reach a deep position at the time of applying a reverse bias. As a result, a source-drain withstand voltage can be increased.

The method of manufacturing a semiconductor device of the embodiment 4 includes substantially the same steps as the method of manufacturing a semiconductor device of the embodiment 1 with respect to points other than the point that the method of the embodiment 4 includes the p-type diffusion region forming step and hence, the method of manufacturing a semiconductor device of the embodiment 4 acquires advantageous effects which correspond to advantageous effects out of advantageous effects which the method of manufacturing a semiconductor device of the embodiment 1 can acquire.

Embodiment 5

Figure 12:
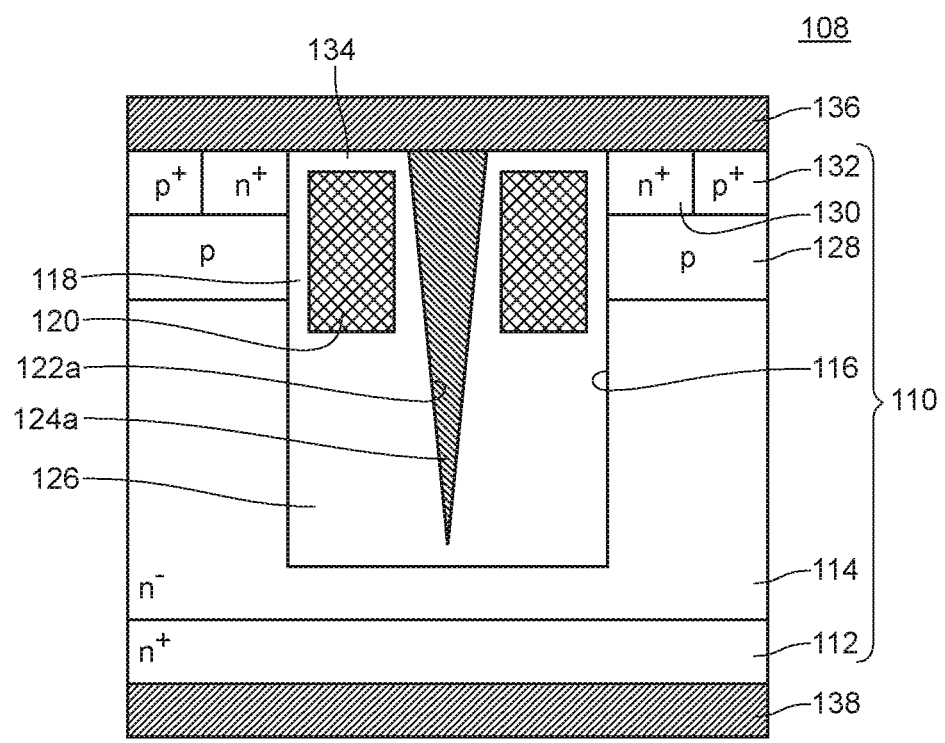
FIG. 12 is a cross-sectional view of a semiconductor device 104 of an embodiment 5.

A semiconductor device 104 of the embodiment 5 basically has substantially the same configuration as the semiconductor device 100 of the embodiment 1. However, the semiconductor device 104 of the embodiment 5 differs from the semiconductor device 100 of the embodiment 1 with respect to a shape of a shield electrode. That is, in the semiconductor device 104 of the embodiment 5, as shown in FIG. 12, the shield electrode 124a has side surfaces which form a bottom narrowed tapered shape.

The semiconductor device 104 of the embodiment 5 can be manufactured by a method of manufacturing a semiconductor device of the embodiment 5 described hereinafter.

Figure 13A:
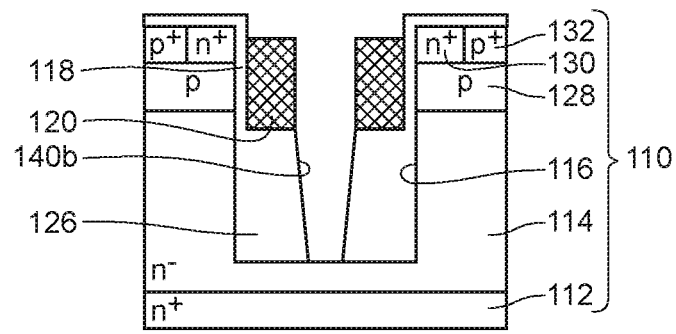
FIG. 13A to FIG. 13C are cross-sectional views for describing respective steps of a method of manufacturing a semiconductor device of the embodiment 5.

The method of manufacturing a semiconductor device of the embodiment 5 basically has substantially the same steps as the method of manufacturing a semiconductor device of the embodiment 1. However, the method of manufacturing a semiconductor device of the embodiment 5 differs from the method of manufacturing a semiconductor device of the embodiment 1 with respect to a shape of a second trench formed in a second trench forming step. That is, in the second trench forming step of the method of manufacturing a semiconductor device of the embodiment 5, as shown in FIG. 13A, a trench having side surfaces which form a bottom narrowed tapered shape is formed as the second trench 140b.

In the second trench forming step, a trench having side surfaces which form a bottom narrowed tapered shape is formed by adjusting conditions of an etching gas (a kind, a temperature and the like of the etching gas).

Figure 13B:
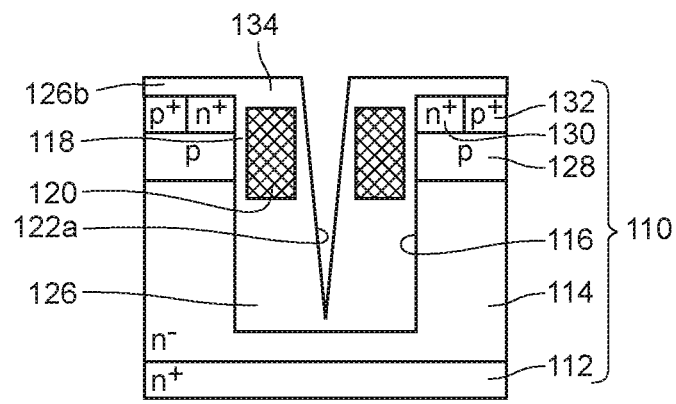

Then, in a second insulation film forming step, a gap 122a also has side surfaces which form a bottom narrowed tapered shape for forming a second insulation film 126b along a surface of the second trench 140b (to be more specific, the gap 122a having a triangular shape extending downward in a convex shape) (see FIG. 13B).

Figure 13C:
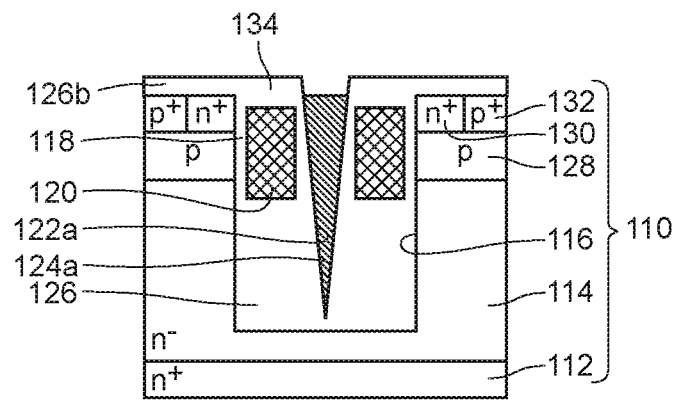
Figure 14A:
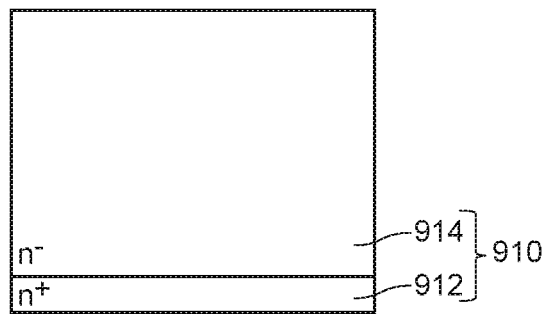
FIG. 14A to FIG. 14D are views for describing respective steps of a conventional method of manufacturing a semiconductor device.
Figure 14B:
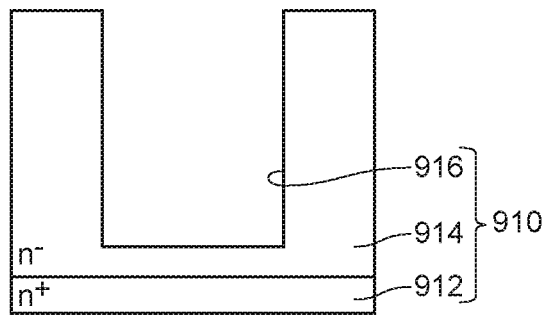
Figure 14C:
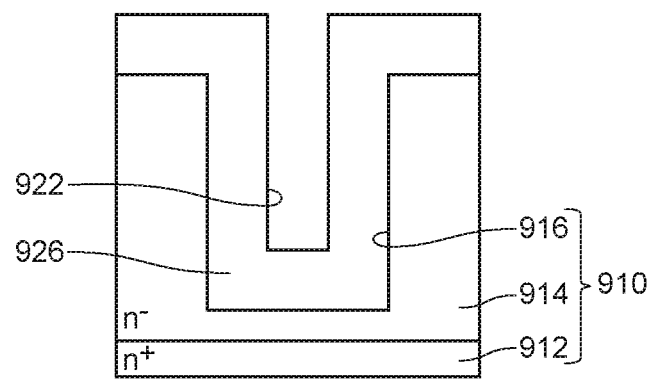
Figure 14D:
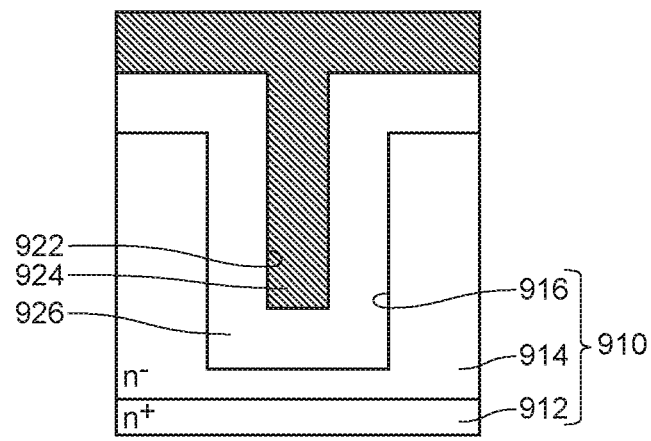
Figure 15A:
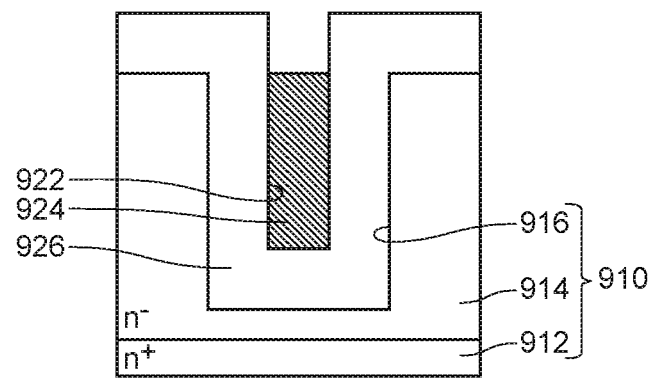
FIG. 15A to FIG. 15D are views for describing respective steps of a conventional method of manufacturing a semiconductor device.
Figure 15B:
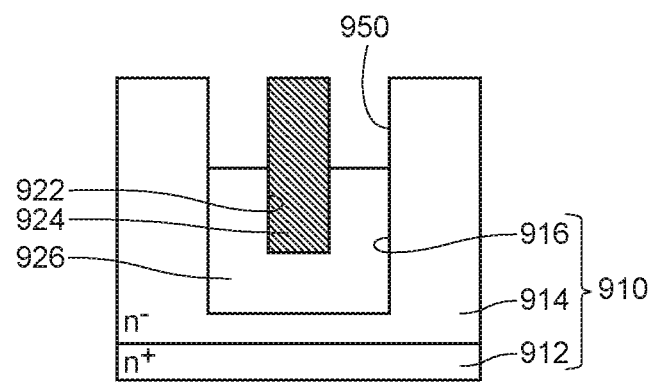
Figure 15C:
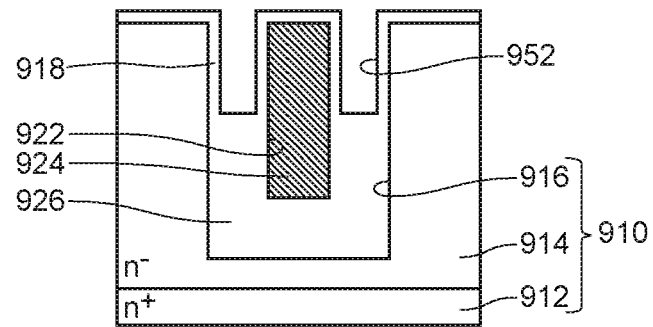
Figure 15D:
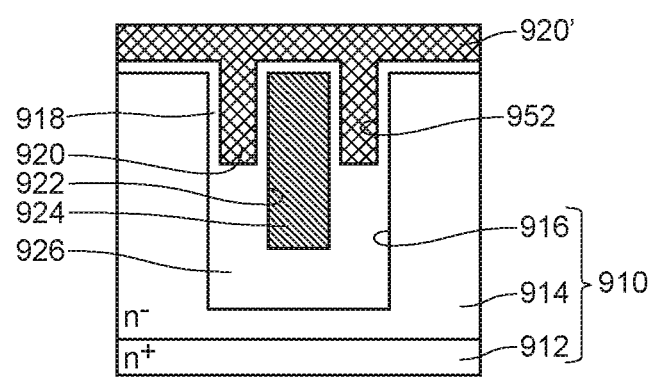
Figure 16A:
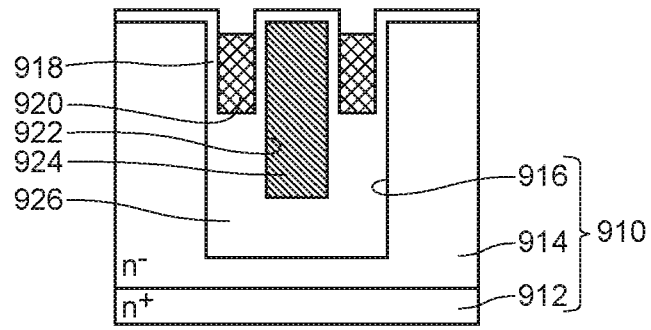
FIG. 16A to FIG. 16D are views for describing respective steps of a conventional method of manufacturing a semiconductor device.
Figure 16B:
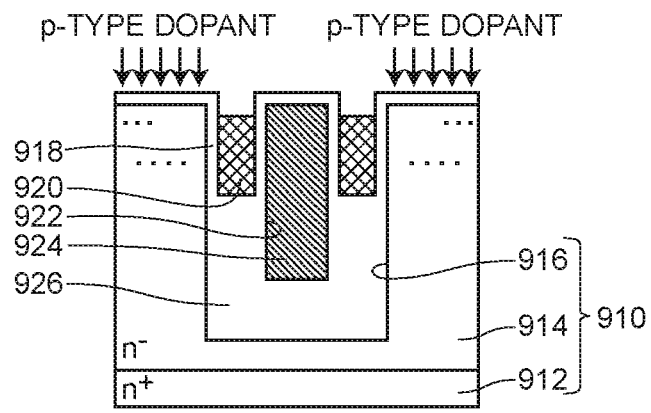
Figure 16C:
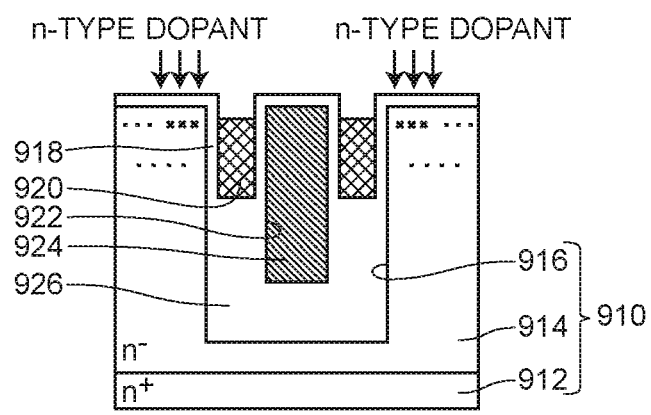
Figure 16D:
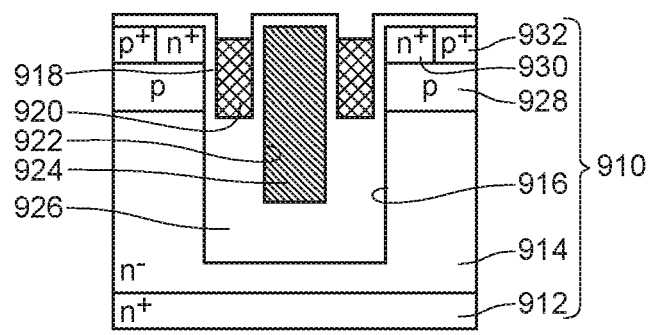
Figure 17A:
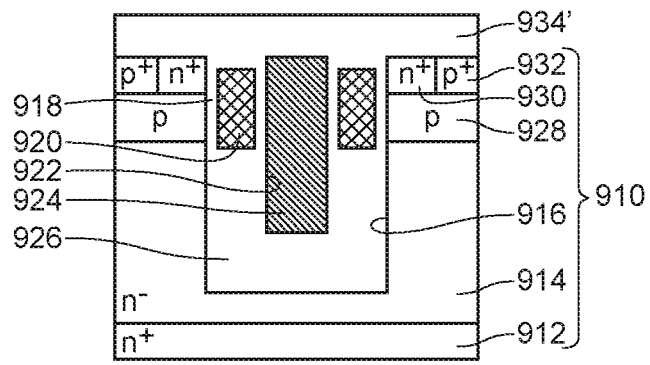
FIG. 17A to FIG. 17C are views for describing respective steps of a conventional method of manufacturing a semiconductor device (symbol 938 indicating a drain electrode in FIG. 17C).
Figure 17B:
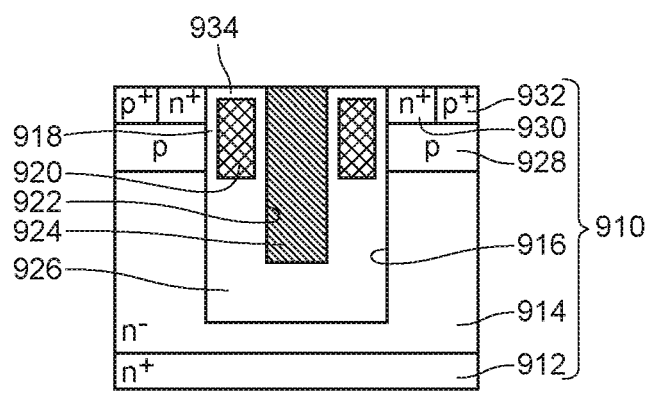
Figure 17C:
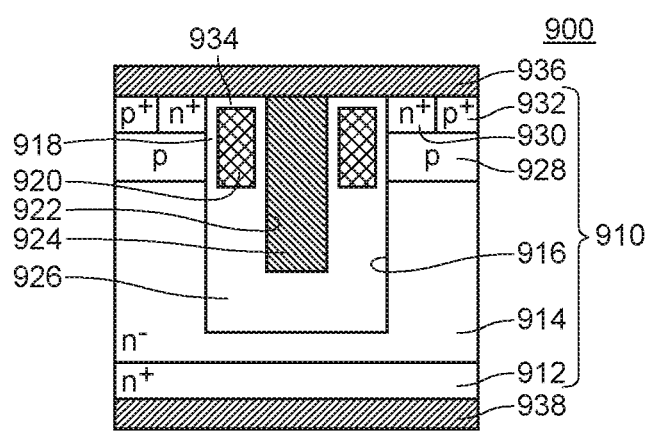

Then, in the shield electrode forming step, a shield electrode 124a having side surfaces which form a bottom narrowed tapered shape can be formed by filling polysilicon into the above-mentioned gap 122a (see FIG. 13C).

In this manner, the method of manufacturing a semiconductor device of the embodiment 5 differs from the method of manufacturing a semiconductor device of the embodiment 1 with respect to the shape of the second trench formed in the second trench forming step. However, in the same manner as the method of manufacturing a semiconductor device of the embodiment 1, the method of the embodiment 5 includes the shield electrode forming step as a step which comes after the gate electrode forming step and hence, the insulation films (for example, the gate insulation film and the protective insulation film) are not formed above the shield electrode 124 by a step which comes before the source electrode forming step. Accordingly, an insulation film removing step of removing the insulation films becomes unnecessary and hence, a step of establishing the connection between the shield electrode 124 and the source electrode 136 can be simplified.

According to the method of manufacturing a semiconductor device of the embodiment 5, in the second trench forming step, the trench having side surfaces which form a bottom narrowed tapered shape is formed as the second trench 140b and hence, a voltage applied to an upper portion of the shield electrode 124a becomes higher than a voltage applied to a lower portion of the shield electrode 124a. Accordingly, at the time of turning off the semiconductor device, a change in potential of a drain electrode can be alleviated. As a result, at the time of turning off the semiconductor device, a surge voltage can be lowered.

The method of manufacturing a semiconductor device of the embodiment 5 includes substantially the same steps as the method of manufacturing a semiconductor device of the embodiment 1 with respect to points other than the shape of the second trench formed in the second trench forming step and hence, the method of manufacturing a semiconductor device of the embodiment 5 acquires advantageous effects which correspond to advantageous effects out of advantageous effects which the method of manufacturing a semiconductor device of the embodiment 1 can acquire.

Although the present invention has been described based on the above-mentioned embodiments heretofore, the present invention is not limited to the above-mentioned embodiments. The present invention can be carried out in various modes without departing from the gist of the present invention. For example, the following modifications of the present invention are conceivable.

(1) The number, materials, shapes, positions, sizes and the like of the constitutional elements described in the above-mentioned embodiments are merely examples, and can be changed within a range where the advantageous effects of the present invention are not impaired.

(2) In the above-mentioned respective embodiments, the first insulation film is formed by a CVD method. However, the present invention is not limited to such a method. The first insulation film may be formed by a thermal oxidation method.

(3) In the above-mentioned respective embodiments, the second insulation film is formed by a thermal oxidation method. However, the present invention is not limited to such a method. The second insulation film may be formed by a CVD method.

(4) In the second trench forming step in the above-mentioned embodiments 1, 2, 4 and 5, the second trench is formed such that the second trench reaches a depth position of the first trench, and in the second trench forming step in the embodiment 3, the second trench is formed such that the second trench reaches a depth position deeper than a depth position of the first trench. However, the present invention is not limited to such second trench forming steps. In the second trench forming step, the second trench may be formed such that the second trench reaches a depth position shallower than a depth position of the first trench.

(5) In the above-mentioned second insulation film forming steps of the respective embodiments, the second insulation film is formed such that the relationship of $D1<d+D2$ is satisfied. However, the present invention is not limited to such a relationship. In the second insulation film forming step, the second insulation film may be formed such that a relationship of $D1=d+D2$ is satisfied. In this case, in the second trench forming step, the second trench is formed such that the second trench reaches a depth position shallower than a depth position of the first trench.

(6) In the above-mentioned respective embodiments, an n-type dopant is injected after a p-type dopant is injected. However, the present invention is not limited to such a dopant injection method. A p-type dopant may be injected after an n-type dopant is injected.

(7) In the above-mentioned respective embodiments, dopants are collectively activated after a p-type dopant and an n-type dopant are injected. However, the present invention is not limited to such a dopant injection method. Dopant activation may be performed every time after each dopant is injected.

(8) In the above-mentioned respective embodiments, the base region 128, the source region 130 and the contact region 132 are formed before the shield electrode is formed. However, the present invention is not limited to such an order of forming these regions. The base region 128, the source region 130 and the contact region 132 may be formed after the shield electrode is formed.

(9) In the above-mentioned respective embodiments, the trench (first trench), the gate electrode and the shield electrode are respectively formed into a stripe shape as viewed in a plan view. However, the present invention is not limited to such a configuration. The trench (first trench), the gate electrode and the shield electrode may be respectively formed in a grid shape or a dot shape (a columnar shape as viewed stereoscopically) as viewed in a plan view.

(10) In the above-mentioned respective embodiments, polysilicon is used as a material for forming the shield electrode. However, the present invention is not limited to such a material. Metal may be used as a material for forming the shield electrode.

(11) In the above-mentioned respective embodiments, the description has been made by taking a MOSFET as an example of the semiconductor device. However, the present invention is not limited to such a case. The present invention is applicable to various other devices besides a MOSFET without departing from the gist of the present invention.

The invention claimed is:

1. A method of manufacturing a semiconductor device having a shield gate structure where a gate electrode and a shield electrode are separated from each other in an in-plane direction, the method comprising in the following order:
    a semiconductor base body preparing step of preparing a semiconductor base body having a first conductive-type first semiconductor layer and a first conductive-type second semiconductor layer having lower concentration than the first semiconductor layer;
    a first trench forming step of forming a predetermined first trench on the second semiconductor layer;
    a first insulation film forming step of forming a first insulation film such that the first insulation film is filled in a lower portion of the first trench;
    a gate insulation film forming step of forming a gate insulation film on a side wall of an upper portion of the first trench;
    a gate electrode forming step of forming the gate electrode made of polysilicon with the gate insulation film interposed between the upper portion of the first trench and the gate electrode;
    a second trench forming step of forming a second trench in the inside of the first trench by removing a center portion of the first insulation film by etching;
    a second insulation film forming step of forming a second insulation film in at least the inside of the second trench under a condition that a gap remain in the inside of the second trench;
    a shield electrode forming step of forming the shield electrode in the inside of the gap; and
    a source electrode forming step of forming a source electrode such that the source electrode is electrically connected to the shield electrode.

2. The method of manufacturing a semiconductor device according to claim 1, wherein in the second insulation film forming step, the second insulation film is formed such that a thickness of the second insulation film is larger than a thickness of the gate insulation film.

3. The method of manufacturing a semiconductor device according to claim 1, wherein in the second insulation film forming step, assuming a thickness of the second insulation film between a bottom of the gap and a bottom of the first trench as D1, a thickness of the first insulation film between a side wall of the gap at a depth position of the bottom of the gap and a side wall of the first trench as d, and a thickness of the second insulation film between the side wall of the gap at the depth position of the bottom of the gap and the side wall of the first trench as D2, the second insulation film is formed such that a relationship of $D1 \leq d+D2$ is satisfied.

4. The method of manufacturing a semiconductor device according to claim 1, wherein in the second trench forming step, the second trench is formed such that the second trench reaches a depth position of the first trench.

5. The method of manufacturing a semiconductor device according to claim 1, wherein in the second trench forming step, the second trench is formed such that the second trench reaches a depth position deeper than a depth position of the first trench.

6. The method of manufacturing a semiconductor device according to claim 1, further comprising a second conductive-type diffusion region forming step of forming a second conductive-type diffusion region such that the second conductive-type diffusion region is brought into contact with the bottom of the second trench, between the second trench forming step and the second insulation film forming step.

7. The method of manufacturing a semiconductor device according to claim 1, wherein in the second trench forming step, a trench having side surfaces which form a bottom narrowed tapered shape is formed as the second trench.

8. The method of manufacturing a semiconductor device according to claim 1, further comprising: a base region forming step of forming a second conductive-type base region on a surface of the second semiconductor layer in a region where the first trench is not formed as viewed in a plan view; and a first conductive-type high concentration diffusion region forming step of forming a first conductive-type high concentration diffusion region on a surface of the base region such that at least a portion of the first conductive-type high concentration diffusion region is exposed on the side wall of the first trench, between the gate electrode forming step and the second trench forming step.

9. The method of manufacturing a semiconductor device according to claim 8, further comprising:
    a contact region forming step of forming a second conductive-type contact region in a predetermined region of a surface of the base region between the gate electrode forming step and the second trench forming step; and
    a second insulation film etching back step where the second insulation film in a region where the first trench is not formed as viewed in a plan view is removed by etching back between the shield electrode forming step and the source electrode forming step, wherein
    in the source electrode forming step, the source electrode is formed such that the source electrode is directly connected to the shield electrode, the first conductive-type high concentration diffusion region and the contact region.

10. The method of manufacturing a semiconductor device according to claim 8, further comprising: an opening forming step of forming a predetermined opening in the second insulation film; and a metal plug forming step of forming a metal plug by filling the inside of the opening with metal between the shield electrode forming step and the source electrode forming step, wherein in the source electrode forming step, the source electrode is formed such that the source electrode is directly connected to the shield electrode and is connected to the first conductive-type high concentration diffusion region and the base region through the metal plug.

11. The method of manufacturing a semiconductor device according to claim 1, wherein in the first insulation film forming step, the first insulation film is formed by a CVD method.

12. The method of manufacturing a semiconductor device according to claim 1, wherein in the first insulation film forming step, the first insulation film is formed by a thermal oxidation method.

13. The method of manufacturing a semiconductor device according to claim 1, wherein in the second insulation film forming step, the second insulation film is formed by a CVD method.

14. The method of manufacturing a semiconductor device according to claim 1, wherein in the second insulation film forming step, the second insulation film is formed by a thermal oxidation method.

* * * * *